(12) United States Patent
Kiuchi

(10) Patent No.: US 10,895,603 B2
(45) Date of Patent: Jan. 19, 2021

(54) VOLTAGE MONITORING MODULE AND VOLTAGE MONITORING SYSTEM TO DETECT A CURRENT LEAKAGE

(71) Applicant: Renesas Electronics Corporation, Tokyo (JP)

(72) Inventor: Hideki Kiuchi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 166 days.

(21) Appl. No.: 15/937,360

(22) Filed: Mar. 27, 2018

(65) Prior Publication Data

US 2018/0217206 A1 Aug. 2, 2018

Related U.S. Application Data

(63) Continuation of application No. 14/002,317, filed as application No. PCT/JP2012/001286 on Feb. 24, 2012, now Pat. No. 9,945,910.

(30) Foreign Application Priority Data

Mar. 31, 2011 (JP) .................................. 2011-079864

(51) Int. Cl.
*G01R 31/36* (2020.01)
*G01R 31/3835* (2019.01)
(Continued)

(52) U.S. Cl.
CPC ........ *G01R 31/3835* (2019.01); *B60L 3/0046* (2013.01); *B60L 3/0069* (2013.01);
(Continued)

(58) Field of Classification Search
CPC .. G01R 31/362; G01R 31/3658; G01R 31/36; H01M 10/48; H01M 2010/4271; H02J 7/0016; H02J 7/0021
(Continued)

(56) References Cited

U.S. PATENT DOCUMENTS 3,714,567 A 1/1973 Kusters
4,134,060 A 1/1979 Feldman
(Continued)

FOREIGN PATENT DOCUMENTS

DE 10051984 A1 6/2001
EP 1617229 A1 1/2006
(Continued)

OTHER PUBLICATIONS

"What are the advantages of switching circuits?" Bob, yahoo answers, answers.yahoo.com/question/index?qid=20100905005653AAkzUhG.*
(Continued)

*Primary Examiner* — Robert Grant
*Assistant Examiner* — John T Trischler
(74) *Attorney, Agent, or Firm* — McGinn IP Law Group, PLLC

(57) ABSTRACT

A voltage monitoring module including a first input terminal coupled to a high-voltage-side terminal of a battery cell through a first path including an external resistor, a first terminal coupled to the high-voltage-side terminal of the battery cell through a second path; a first switch coupled to the first input terminal, a second switch coupled to the first terminal; a second input terminal and a second terminal coupled to a low-voltage-side terminal of the battery cell, a third switch that is coupled to the second input terminal; a fourth switch that is coupled to the second terminal, and a control circuit that controls ON/OFF of the first through fourth switches, wherein an element that suppresses fluctuation of a voltage input to the first switch through the first input terminal that is coupled between the first switch and a fixed voltage.

18 Claims, 14 Drawing Sheets

(51) Int. Cl.
  *G01R 31/396* (2019.01)
  *B60L 3/00* (2019.01)
  *B60L 3/04* (2006.01)
  *H01M 10/48* (2006.01)
  *H02J 7/00* (2006.01)
  *B60L 58/18* (2019.01)
  *H01M 10/42* (2006.01)

(52) U.S. Cl.
  CPC ............... *B60L 3/04* (2013.01); *B60L 58/18* (2019.02); *G01R 31/396* (2019.01); *H01M 10/48* (2013.01); *H02J 7/0016* (2013.01); *H02J 7/0021* (2013.01); *B60L 2240/547* (2013.01); *H01M 2010/4271* (2013.01); *Y02T 10/70* (2013.01)

(58) Field of Classification Search
  USPC ..................................................... 324/426
  See application file for complete search history.

(56) References Cited

U.S. PATENT DOCUMENTS

| | | |
|---|---|---|
| 4,316,185 A | 2/1982 | Watrous |
| 4,506,253 A | 3/1985 | Mande |
| 5,254,951 A | 10/1993 | Goto |
| 5,323,100 A | 6/1994 | Iketani |
| 5,418,401 A | 5/1995 | Kaneyuki |
| 5,565,853 A * | 10/1996 | Jun-Young ............ G08B 17/10 340/635 |
| 5,760,587 A * | 6/1998 | Harvey ............... G01R 31/007 320/106 |
| 5,867,008 A | 2/1999 | Du |
| 5,949,233 A * | 9/1999 | Mashiko ............ H02J 7/0026 324/433 |
| 6,163,131 A | 12/2000 | Gartstein |
| 6,362,627 B1 | 3/2002 | Shimamoto |
| 6,373,225 B1 | 4/2002 | Haraguchi |
| 6,700,384 B2 * | 3/2004 | Yugou ............. G01R 19/16542 324/434 |
| 6,803,766 B2 | 10/2004 | Kobayashi |
| 7,023,178 B2 | 4/2006 | Iwabuchi |
| 7,026,788 B2 | 4/2006 | Yano |
| 7,078,908 B2 * | 7/2006 | Fujita .................. B60L 58/21 324/433 |
| 7,292,053 B2 | 11/2007 | Suzuki |
| 7,453,232 B2 | 11/2008 | Furukawa |
| 7,592,774 B2 | 9/2009 | Morimoto |
| 7,659,692 B2 | 2/2010 | Sainomoto |
| 7,663,375 B2 | 2/2010 | Yonezawa |
| 7,679,369 B2 | 3/2010 | Hartzog |
| 7,924,016 B2 | 4/2011 | Shimizu |
| 8,134,335 B2 | 3/2012 | Osawa |
| 8,154,245 B2 * | 4/2012 | Veselic ................ G06F 1/266 320/106 |
| 8,212,385 B2 | 7/2012 | Oosawa |
| 8,212,571 B2 | 7/2012 | Emori et al. |
| 8,242,746 B2 * | 8/2012 | Austerschulte .... G01R 31/3835 320/120 |
| 8,242,770 B2 | 8/2012 | Tanaka |
| 8,258,792 B2 | 9/2012 | Vandensande |
| 8,319,650 B2 | 11/2012 | Volodymyr |
| 8,330,469 B2 * | 12/2012 | Miyamoto ............ G01R 15/04 324/433 |
| 8,384,353 B2 | 2/2013 | Miyazaki |
| 8,421,466 B2 | 4/2013 | Kang |
| 8,547,064 B2 | 10/2013 | Cooper |
| 8,598,897 B2 | 12/2013 | Nalbant |
| 8,749,244 B2 | 6/2014 | Hauser |
| 8,779,784 B2 | 7/2014 | Yang |
| 8,786,289 B2 | 7/2014 | Sekiguchi |
| 8,788,225 B2 | 7/2014 | Wood |
| 8,788,226 B2 | 7/2014 | Sheng |
| 8,860,422 B2 | 10/2014 | Butzmann |
| 9,030,205 B2 | 5/2015 | Kamata |
| 9,035,611 B2 | 5/2015 | Kikuchi |
| 9,088,053 B2 * | 7/2015 | Suzuki ............... H01M 10/441 |
| 9,203,248 B2 | 12/2015 | Ohkawa |
| 9,329,239 B2 * | 5/2016 | Kunimitsu .......... G01R 31/382 |
| 9,341,679 B2 * | 5/2016 | Miyamoto ............ G01R 15/04 |
| 9,470,761 B2 | 10/2016 | Kiuchi |
| 9,562,949 B2 * | 2/2017 | Kuroda .............. H01M 10/4285 |
| 9,620,982 B2 * | 4/2017 | Suzuki ............... H01M 10/441 |
| 9,632,144 B2 * | 4/2017 | Kiuchi ................. H01M 10/48 |
| 10,254,351 B2 * | 4/2019 | Kiuchi ................. H01M 10/48 |
| 2001/0035765 A1 | 11/2001 | Maki |
| 2002/0008523 A1 | 1/2002 | Klang |
| 2003/0030440 A1 * | 2/2003 | Yugou ............. G01R 19/16542 324/425 |
| 2003/0137319 A1 * | 7/2003 | Furukawa ........... B60L 3/0023 324/426 |
| 2004/0160229 A1 * | 8/2004 | Fujita .................. B60L 58/21 324/607 |
| 2005/0264264 A1 * | 12/2005 | Yano .................... G01R 31/50 320/132 |
| 2006/0006840 A1 * | 1/2006 | Furukawa ............. B60L 3/12 320/116 |
| 2006/0043933 A1 | 3/2006 | Latinis |
| 2006/0043981 A1 | 3/2006 | Drouin |
| 2007/0040544 A1 | 2/2007 | Suzuki |
| 2007/0108940 A1 | 5/2007 | Sainomoto |
| 2007/0285057 A1 * | 12/2007 | Yano .................. B60L 3/0046 320/116 |
| 2008/0054907 A1 | 3/2008 | Kudo |
| 2008/0084217 A1 | 4/2008 | Hartzog |
| 2008/0164881 A1 | 7/2008 | Miyamoto |
| 2008/0197910 A1 | 8/2008 | Isomura |
| 2008/0265901 A1 | 10/2008 | Shimizu |
| 2009/0079434 A1 | 3/2009 | Osawa |
| 2009/0091332 A1 | 4/2009 | Emori et al. |
| 2009/0198399 A1 | 8/2009 | Kubo et al. |
| 2010/0052419 A1 | 3/2010 | Oosawa et al. |
| 2010/0052656 A1 | 3/2010 | Tanaka |
| 2010/0141268 A1 | 6/2010 | Hartzog |
| 2010/0156426 A1 | 6/2010 | Kang et al. |
| 2010/0253357 A1 | 10/2010 | Seo |
| 2010/0259276 A1 | 10/2010 | Streit |
| 2010/0270973 A1 | 10/2010 | Miyazaki |
| 2010/0283473 A1 | 11/2010 | Vandensande |
| 2011/0172940 A1 | 7/2011 | Wood |
| 2011/0260770 A1 | 10/2011 | Sekiguchi |
| 2012/0016613 A1 | 1/2012 | Yang |
| 2012/0025769 A1 | 2/2012 | Kikuchi |
| 2012/0139545 A1 | 6/2012 | Makihara |
| 2012/0175953 A1 | 7/2012 | Ohkawa |
| 2012/0194199 A1 * | 8/2012 | Mizoguchi ........... G01R 31/396 324/433 |
| 2012/0253716 A1 | 10/2012 | Tsuchiya |
| 2013/0027049 A1 | 1/2013 | Sukup |
| 2013/0106428 A1 | 5/2013 | Miyamoto |
| 2013/0320991 A1 | 12/2013 | Kiuchi |
| 2014/0015454 A1 * | 1/2014 | Kunimitsu .......... H01M 10/482 318/139 |
| 2015/0260799 A1 * | 9/2015 | Kuroda .............. H01M 10/4285 324/434 |
| 2016/0231384 A1 * | 8/2016 | Miyamoto ............ G01R 15/04 |
| 2019/0146040 A1 * | 5/2019 | Murakami ............ G01R 31/36 324/430 |
| 2019/0245252 A1 * | 8/2019 | Maki ............... G01R 19/16542 |
| 2019/0285699 A1 * | 9/2019 | Weidner ............. G01R 31/396 |
| 2019/0372178 A1 * | 12/2019 | Pennisi .............. G01R 31/396 |

FOREIGN PATENT DOCUMENTS

| | | |
|---|---|---|
| EP | 1750139 A2 | 2/2007 |
| JP | 2002-247771 A | 8/2002 |
| JP | 2003-61254 A | 2/2003 |
| JP | 3580123 B1 | 10/2004 |
| JP | 4131394 B2 | 8/2008 |
| JP | 2009-89488 A | 4/2009 |
| JP | 2009-183025 A | 8/2009 |
| JP | 2011-61927 A | 3/2011 |

(56) References Cited

FOREIGN PATENT DOCUMENTS

| WO | WO 2004086065 A1 | 10/2004 |
|---|---|---|
| WO | WO 2008/120163 A2 | 10/2008 |
| WO | WO 2009/158367 A2 | 12/2009 |
| WO | WO 2010/110589 A3 | 1/2011 |

OTHER PUBLICATIONS

"What are TVS Diodes," Semtech, Surging Ideas, S196-01, Published Online Sep. 2000, Accessed Mar. 30, 2016, http://www.semtech.com/images/promo/What_are_TVS_Diodes.pdf.*
Korean Office Action dated Jun. 21, 2018, with an English translation thereof.
Chinese Office Action dated Sep. 8, 2015 with an English translation thereof.
Chinese Office Action dated Mar. 23, 2015 with an English translation thereof.
European Search Report dated Aug. 7, 2014.
Linear Technology Corporation, "LTC6802-2 Multicell Addressable Bettery Stack Monito Datasheet", 2009.
International Search Report dated May 15, 2012 (with English translation thereof).
Communication Pursuant to Article 94(3) EPC in European Application No. 12 764 464.9-1568 dated Oct. 28, 2016.
U.S. Notice of Allowance dated Dec. 13, 2017 in U.S. Appl. No. 14/002,317.
U.S. Final Office Action dated Jun. 28, 2017 in U.S. Appl. No. 14/002,317.
U.S. Non-Final Office Action dated Mar. 9, 2017 in U.S. Appl. No. 14/002,317.
U.S. Final Office Action dated Aug. 9, 2016 in U.S. Appl. No. 14/002,317.
U.S. Non-Final Office Action dated Apr. 1, 2016 in U.S. Appl. No. 14/002,317.

* cited by examiner

VOLTAGE MONITORING MODULE AND VOLTAGE MONITORING SYSTEM TO DETECT A CURRENT LEAKAGE

CROSS-REFERENCE TO RELATED APPLICATIONS

The present application is a Continuation Application of U.S. patent application Ser. No. 14/002,317, filed on Aug. 29, 2013, which is based on International application PCT/JP2012/001286, filed on Feb. 24, 2012, which is based on Japanese Patent Application No. 2011-079864 filed on Mar. 31, 2011, the entire contents of which are hereby incorporated by reference.

TECHNICAL FIELD

The present invention relates to a voltage monitoring module and a voltage monitoring system, and more specifically, to a voltage monitoring module and a voltage monitoring system preventing an incorrect measurement of a voltage.

BACKGROUND ART

In recent years, hybrid cars and electric vehicles have become popular, and more and more vehicles are loaded with batteries in order to obtain electric power. Such a vehicle typically uses an assembled battery including a large number of battery cells connected in series in order to obtain high voltage. The voltages of the battery cells of the assembled battery fluctuate according to use conditions of the vehicle, as is similar to gasoline in gasoline cars. Accordingly, a system for monitoring voltages is necessary to monitor the status of the battery cells.

An example of a voltage monitoring module monitoring voltages of battery cells is already disclosed (Non Patent Literature 1). FIG. 12 is a circuit diagram showing a configuration example of a main part of a voltage monitoring module 300 monitoring voltages of battery cells. Hereinafter, an example that the voltage monitoring module 300 monitors voltages of battery cells EC31 and EC32 connected in series is described. The voltage monitoring module 300 includes switches SW31 to SW33, an A/D converter (ADC) 31, a register 32, a communication circuit 33, a control circuit 34 and input terminals V31 to V33.

A filter circuit 301 and a protection circuit 302 are interposed between the voltage monitoring module 300 and the battery cells EC31 and EC32. The filter circuit 301 includes filter resistors Rf31 to Rf33 and filer capacitors C31 to C33. The high-voltage-side terminal of the battery cell EC31 is coupled to the input terminal V31 through the filter resistor Rf31. The low-voltage-side terminal of the battery cell EC31 and the high-voltage-side terminal of the battery cell EC32 are coupled to the input terminal V32 through the filter resistor Rf32. The low-voltage-side terminal of the battery cell EC32 is coupled to the input terminal V33 through the filter resistor Rf32. The filter capacitors C31 to C33 are coupled between the input terminals V31 to V33 and a ground, respectively. Thus, the filter circuit 301 functions an RC filter, thereby preventing high frequency noise from flowing into the voltage monitoring module 300.

The protection circuit 302 includes protection diodes D31 to D33. The protection diodes D31 to D33 are coupled between the input terminals V31 to V33 and the ground, respectively. Thus, breakdowns of the protection diodes D31 to D33 occur when overvoltage is applied to the input terminals V31 to V33, so that the overvoltage is prevented from being applied to the voltage monitoring module 300.

The switches SW31 to SW33 are coupled between the input terminal V31 to V33 and the ADC 31, respectively. The control circuit 34 controls ON/OFF of the switches SW31 to SW33. The ADC 31 outputs voltage values of the input terminal V31 to V33 to the resister 32, when the switches SW31 to SW33 are turned on. The resister 32 is controlled by the control circuit 34 and outputs the voltage values of the input terminal V31 to V33 to an external circuit (not shown in the drawings). The external circuit (not shown in the drawings) calculates a voltage of the battery cell EC31 from a voltage difference between the input terminal V31 and the input terminal V32. Similarly, the external circuit (not shown in the drawings) calculates a voltage of the battery cell EC32 from a voltage difference between the input terminal V32 and the input terminal V33. When the voltage of the high-voltage-side terminal of the battery cell EC31 is V+, and the low-voltage-side terminal of the battery cell EC31 is V−, the voltage V_EC31 of the battery cell EC31 can be expressed by the following expression (1).

$$V\_EC31 = V+ - V- \quad (1)$$

In addition, a direct current power supply unit for vehicles that has a diagnostic function to diagnose malfunction of a measurement circuit of a terminal voltage of the battery cell is proposed (Patent Literature 1).

CITATION LIST

Patent Literature

Patent Literature 1: Japanese Unexamined Patent Application Publication No. 2009-89488

Non Patent Literature

Non Patent Literature 1: Linear Technology Corporation, "LTC6802-2 Multicell Addressable Battery Stack Monitor Datasheet"

SUMMARY OF INVENTION

Technical Problem

However, the present inventor has considered the voltage monitoring module 300 described above, and found that malfunction of voltage monitoring of the battery cell may occur in the voltage monitoring module 300. The mechanism of the problem is described below. The voltage monitoring module 300 is coupled the filter circuit 301 and the protection circuit 302. When a leak occurs in elements constituting these circuits, the voltage monitoring module 300 fails to accurately measure a voltage of the battery cell.

Hereinafter, the case of measuring the voltage of the battery cell EC31 is described. In this case, the switches SW31 and SW32 are turned on. In this state, a leak current Ic may flow through the filter capacitor C31 due to malfunction of the filter capacitor C31. FIG. 13 is a circuit diagram showing voltage measurement of the voltage monitoring module 300 when a leak current flows through the filter capacitor C31.

As shown in FIG. 13, a voltage drop occurs at the filter resistor Rf31 when the leak current Ic flows. The voltage drop generated by the filter resistor Rf31 is Rf31×Ic. Thus, the voltage of the input terminal V31 can be expressed by the following expression (2).

$$V31 = V+ - Rf31 \times Ic \quad (2)$$

Therefore, a normal measurement voltage ΔV between the input terminal V31 and the input terminal V32 can be expressed by the following expression (3).

$$\Delta V = V_+ - V_- - Rf31 \times Ic \quad (3)$$

Therefore, the voltage between the input terminal V31 and the input terminal V32 becomes lower by Rf31×Ic compared with the case when there is no leak current. As a result, the voltage ΔV lower by Rf31×Ic than the voltage V_EC31, which is an original voltage, is incorrectly measured as a voltage of the battery cell EC31.

Similarly, a leak current Id may flow through the protection diode D31 due to malfunction of the protection diode D31. FIG. 14 is a circuit diagram showing voltage measurement of the voltage monitoring module 300 when a leak current flows through the protection diode D31.

As shown in FIG. 14, a voltage drop occurs at the filter resistor Rf31 when the leak current Id flows. The voltage drop VRf31 generated by the filter resistor Rf31 is Rf31×Id. Thus, the voltage of the input terminal V31 can be expressed by the following expression (4).

$$V31 = V_+ - Rf31 \times Id \quad (4)$$

Therefore, a voltage ΔV between the input terminal V31 and the input terminal V32 can be expressed by the following expression (5).

$$\Delta V = V_+ - V_- - Rf31 \times Id \quad (5)$$

Therefore, the voltage ΔV between the input terminal V31 and the input terminal V32 becomes lower by Rf31×Id compared with the voltage when there is no leak current. As a result, the voltage ΔV lower by Rf31×Id than the voltage V_EC31, which is an original voltage, is incorrectly measured as a voltage of the battery cell EC31.

As described above, when a leak current flows through an element of a filter circuit or a protection circuit which are external circuits of the voltage monitoring module 300, the voltage monitoring module 300 fails to accurately measure the voltage of the battery cell. As a result, the battery cell is charged in the state incapable of measuring accurate voltage, so that overcharging may occur.

Solution to Problem

A first aspect of the present invention is a voltage monitoring module including: a first input terminal coupled to a high-voltage-side terminal of a battery cell through an external resistor; a first terminal coupled to the high-voltage-side terminal of the battery cell; a first switch coupled to the first input terminal; and a control circuit that controls ON/OFF of the first switch, wherein an element that suppresses fluctuation of a voltage input to the first switch through the first input terminal is coupled between the first switch and a fixed voltage, and the control circuit turns on the first switch, so that a first voltage output from the first input terminal through the first switch is compared with a second voltage output from the first terminal.

Advantageous Effects of Invention

According to the present invention, it is possible to provide the voltage monitoring module that can prevent inaccurate measurement of a voltage due to an influence of voltage drop caused by the leak current when the leak current flows through an element coupled to the battery cell through an external resistor.

BRIEF DESCRIPTION OF DRAWINGS

FIG. 1 is a block diagram showing the configuration of the voltage monitoring system VMS that monitors an output voltage of an assembled battery which supplies power to an electric vehicle or the like;

DESCRIPTION OF EMBODIMENTS

Hereinafter, with reference to the drawings, embodiments of the present invention will be described. Throughout the drawings, the same components are denoted by the same reference symbols, and overlapping description will be omitted as appropriate.

Figure 1:
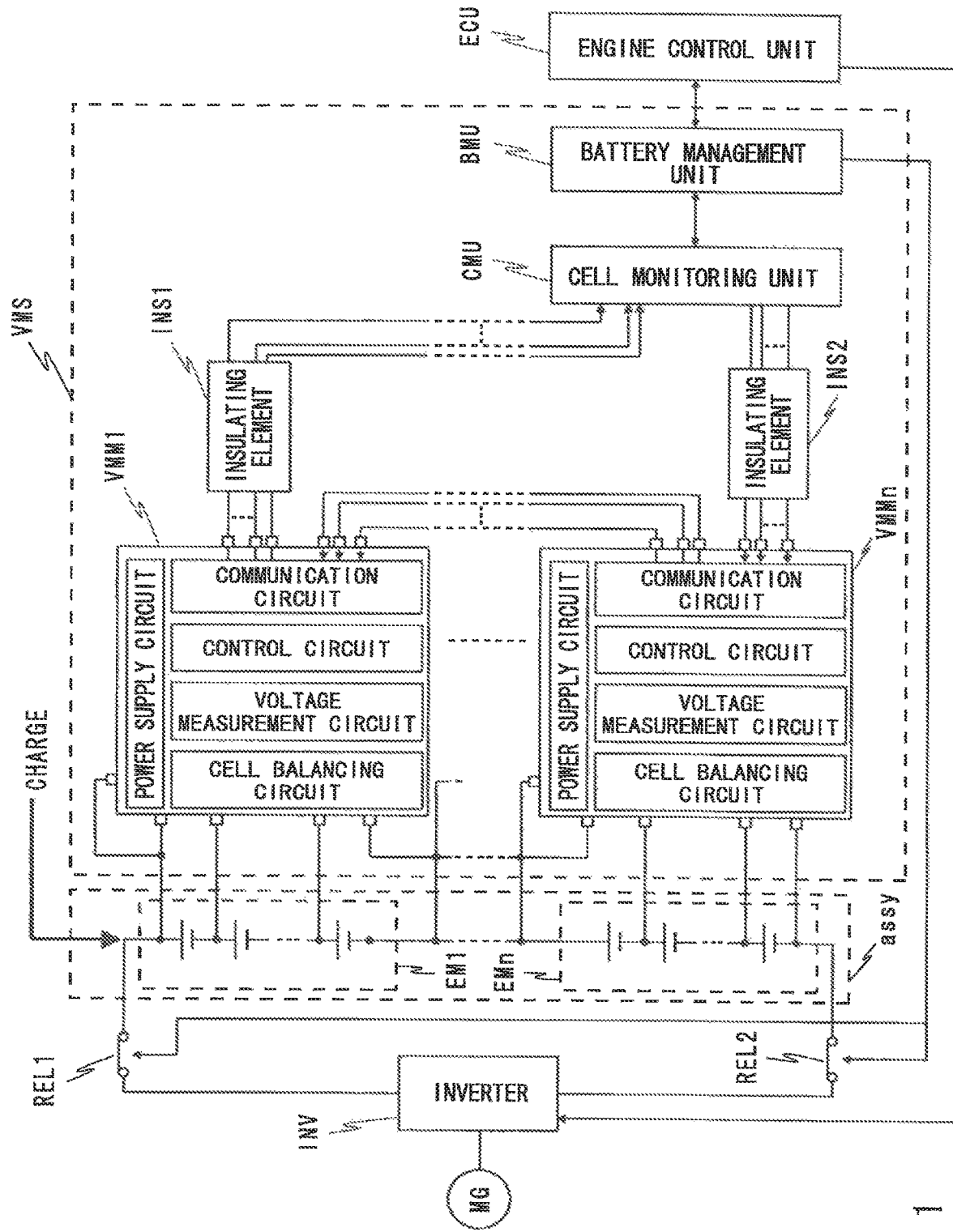

First, as a premise for understanding embodiments of the invention, a voltage monitoring system that monitors an output voltage of an assembled battery which supplies power to an electric vehicle or the like will be described. Referring first to FIG. 1, an outline of a configuration of a voltage monitoring system VMS that monitors an output voltage of an assembled battery which supplies power to an electric vehicle or the like will be described. FIG. 1 is a block diagram showing the configuration of the voltage monitoring system VMS that monitors an output voltage of an assembled battery which supplies power to an electric vehicle or the like. The voltage monitoring system VMS includes voltage monitoring modules VMM1 to VMMn (n is an integer equal to or greater than 2), insulating elements INS1 and INS2, a cell monitoring unit CMU, and a battery management unit BMU. Each of the cell monitoring unit CMU and the battery management unit BMU is configured of a microcomputer (hereinafter, MCU: Micro Computing Unit), for example.

In the voltage monitoring system VMS, the voltage monitoring modules VMM1 to VMMn monitor a voltage of an assembled battery assy. The assembled battery assy includes n battery modules EM1 to EMn which are connected in series. Each of the battery modules EM1 to EMn includes m (m is an integer equal to or greater than 2) battery cells connected in series. That is, in the assembled battery assy, (m×n) battery cells are connected in series. This allows the assembled battery assy to obtain a high output voltage.

The cell monitoring unit CMU is coupled to a communication input terminal of the voltage monitoring module VMMn through the insulating element INS2, and is also coupled to a communication output terminal of the voltage monitoring module VMM1 through the insulating element INS1. Each of the insulating elements INS1 and INS2 is configured of a photocoupler, for example, and electrically isolates the voltage monitoring modules VMM1 to VMMn from the cell monitoring unit CMU. This prevents the cell monitoring unit CMU from being damaged due to application of a high voltage to the cell monitoring unit CMU from the assembled battery assy upon occurrence of a failure, for example.

The cell monitoring unit CMU is further connected to the battery management unit BMU. The cell monitoring unit CMU calculates output voltages of the battery cells from the voltage monitoring results of the voltage monitoring modules VMM1 to VMMn, and notifies the battery management unit BMU of the calculated output voltages. Further, the cell monitoring unit CMU controls the operation of each of the voltage monitoring modules VMM1 to VMMn according to an instruction from the battery management unit BMU. The battery management unit BMU is further connected to an engine control unit ECU. The battery management unit BMU controls the operation of the voltage monitoring system VMS according to the output voltage of each battery cell, which is notified from the cell monitoring unit CMU, and the instruction from the engine control unit ECU. The battery management unit BMU notifies the engine control unit ECU of information on the states of the voltage monitoring system VMS and the assembled battery assy, for example. The operation of each of the cell monitoring unit CMU and the battery management unit BMU will be described in detail in the description related to the operation of the voltage monitoring system VMS which is described later.

Figure 2:
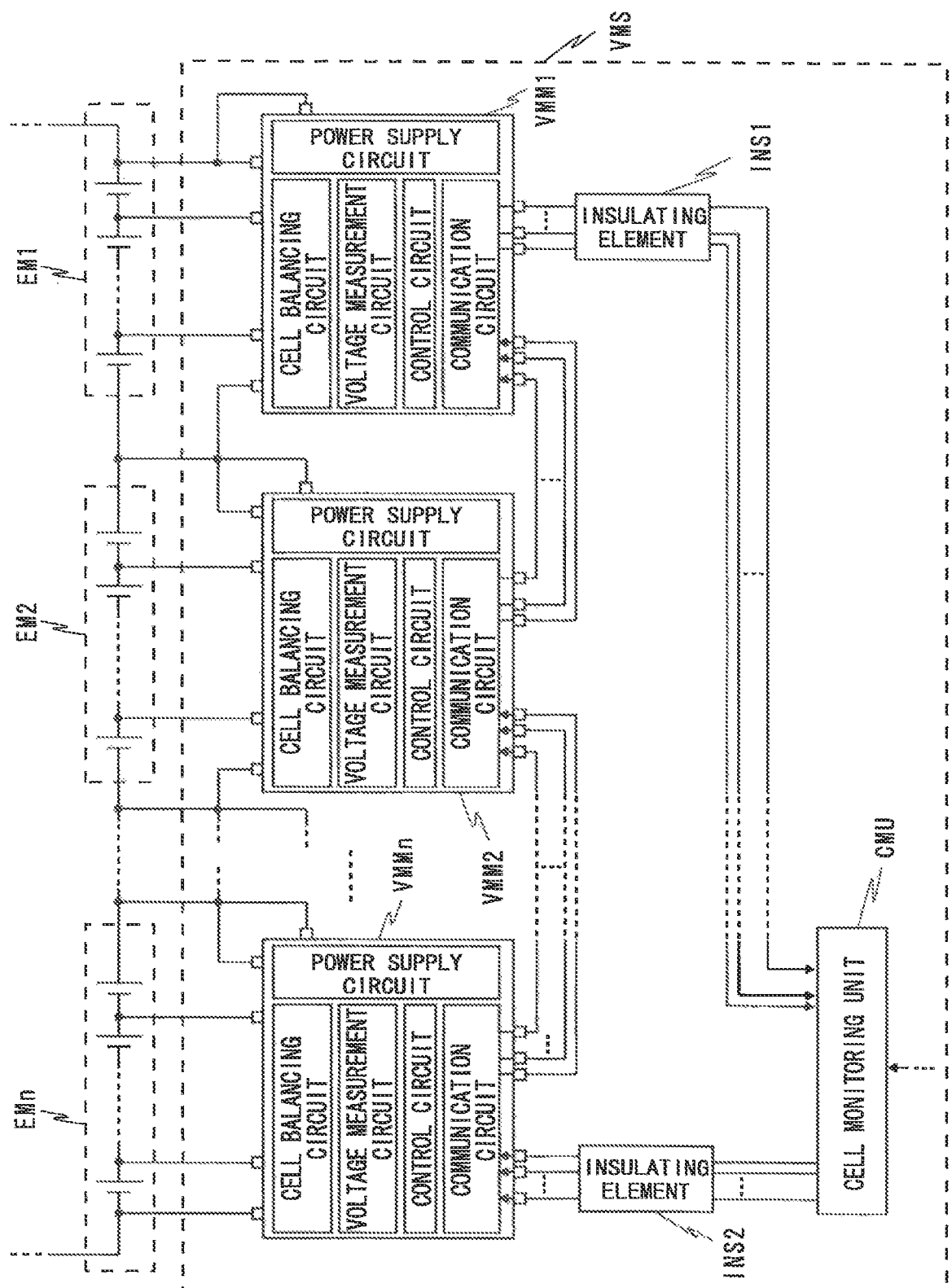
FIG. 2 is a block diagram of a main part of the voltage monitoring system VMS and shows connection relationships between the voltage monitoring modules VMM1 to VMMn and the cell monitoring unit CMU.

Referring next to FIG. 2, connection relationships between the voltage monitoring modules VMM1 to VMMn and the cell monitoring unit CMU will be described. FIG. 2 is a block diagram of a main part of the voltage monitoring system VMS and shows connection relationships between the voltage monitoring modules VMM1 to VMMn and the cell monitoring unit CMU. The voltage monitoring modules VMM1 to VMMn are respectively connected to the battery modules EM1 to EMn, and monitor the respective voltages received from the battery modules EM1 to EMn. The voltage monitoring modules VMM1 to VMMn are configured as a daisy chain. The outputs of communication circuits of the voltage monitoring modules VMM2 to VMMn are respectively connected to the inputs of communication circuits of the voltage monitoring modules VMM1 to VMM(n−1).

The cell monitoring unit CMU outputs a control signal to the voltage monitoring module VMMn through the insulating element INS2. Control signals for the voltage monitoring modules VMM1 to VMM(n−1) are transmitted to the voltage monitoring modules VMM1 to VMM(n−1) by using the daisy chain configuration. This allows the cell monitoring unit CMU to control the operation of each of the voltage monitoring modules VMM1 to VMMn. The voltage monitoring modules VMM1 to VMMn output the monitoring results to the cell monitoring unit CMU through the insulating element INS1 according to the control signal from the cell monitoring unit CMU. The monitoring results from the voltage monitoring modules VMM2 to VMMn are transmitted to the cell monitoring unit CMU by using the daisy chain configuration.

Figure 3:
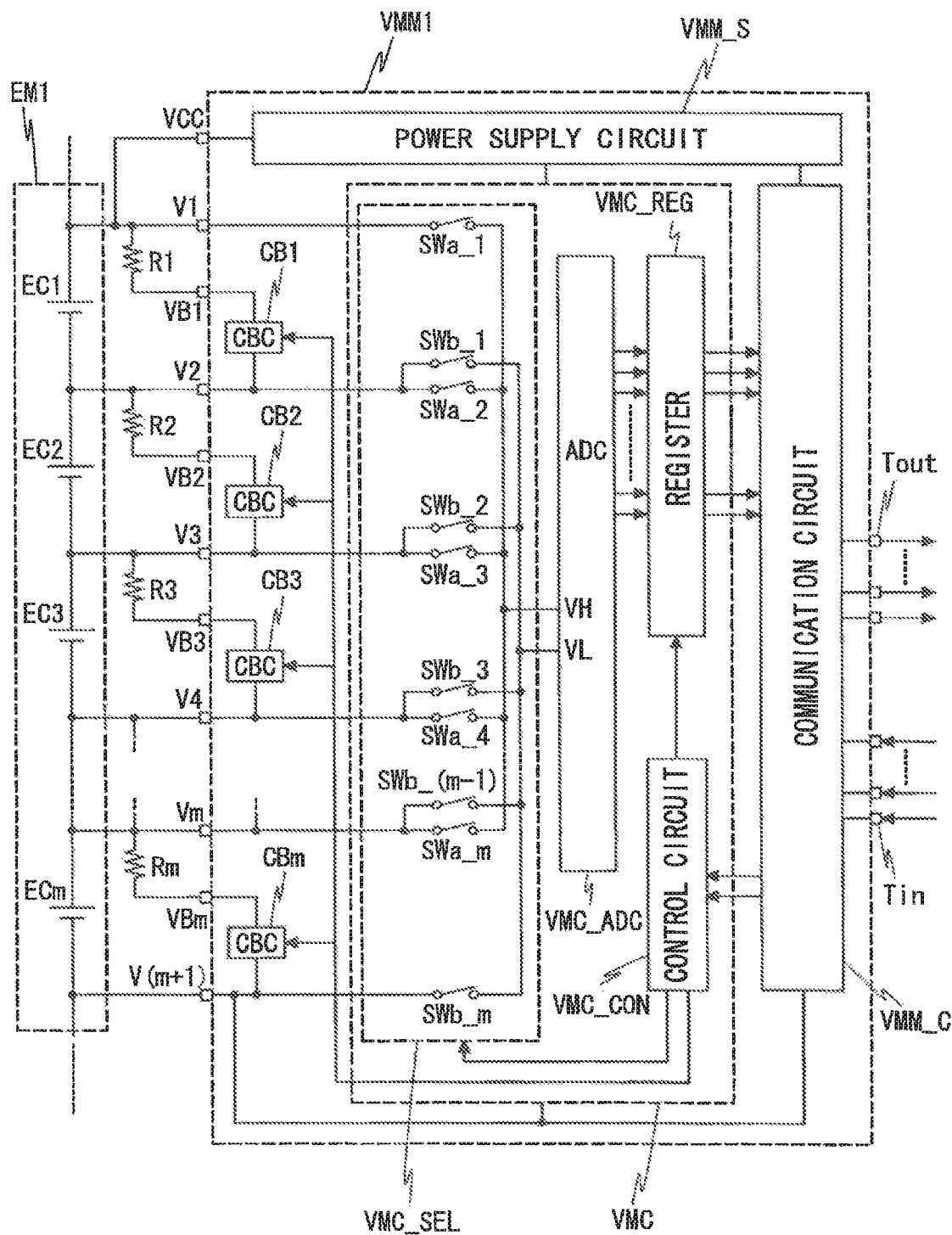
FIG. 3 is a block diagram showing the configuration of the voltage monitoring module VMM1.

Next, the configuration of each of the voltage monitoring modules VMM1 to VMMn will be described. The voltage monitoring modules VMM1 to VMMn have a similar configuration. Accordingly, the configuration of the voltage monitoring module VMM1 will be described as a typical example with reference to FIG. 3. FIG. 3 is a block diagram showing the configuration of the voltage monitoring module VMM1. The voltage monitoring module VMM1 includes a power supply circuit VMM_S, a communication circuit VMM_C, a voltage measurement circuit VMC, cell balancing circuits CB1 to CBm (m is an integer equal to or greater than 2), a power supply terminal VCC, input terminals V1 to V(m+1), cell balancing input terminals VB1 to VBm, a communication input terminal Tin, and a communication output terminal Tout.

In the battery module EM1, battery cells EC1 to ECm are connected in series in the order from the high voltage side. The power supply terminal VCC of the voltage monitoring module VMM1 is coupled to the high voltage side of the battery cell EC1. The low voltage side of the battery cell ECm is coupled to the input terminal V(m+1). The voltage of the input terminal is tapped in the voltage monitoring module VMM1 and is supplied as a ground voltage to each of the voltage measurement circuit VMC and the communication circuit VMM_C. Thus, the output voltage of the battery module EM1 is supplied as a power supply voltage to the voltage monitoring module VMM1. The power supply circuit VMM_S receives the power supply from the battery cell EC1 through the power supply terminal VCC. The power supply circuit VMM_S supplies the power to each of the communication circuit VMM_C and the voltage measurement circuit VMC.

The voltage measurement circuit VMC includes a selection circuit VMC_SEL, an A/D converter (Analog to Digital Converter: ADC) VMC_ADC, a register VMC_REG, and a control circuit VMC_CON. The selection circuit VMC_SEL includes switches SWa_1 to SWa_m and SWb_1 to SWb_m. The switches SWa_1 to SWa_m and SWb_1 to SWb_m are turned on/off according to a control signal from the control circuit VMC_CON. Assuming that j represents an integer ranging from 1 to m, switches SWa_j and SWb_j are simultaneously turned on in the case of measuring a voltage of a battery cell ECj. As a result, the voltage from the high-voltage-side terminal of the battery cell ECj is supplied as a high-voltage-side voltage VH to the A/D converter VMC_ADC through an input terminal Vj. Similarly, the voltage from the low-voltage-side terminal of the battery cell ECj is supplied as a low-voltage-side voltage VL to the A/D converter VMC_ADC through an input terminal V(j+1).

The A/D converter VMC_ADC converts the values of the high-voltage-side voltage VH and the low-voltage-side voltage VL into voltage values which are digital values. Then, the A/D converter VMC_ADC outputs the voltage values, which are digital values, to the register VMC_REG. The register VMC_REG stores the voltage values output from the A/D converter VMC_ADC. The control circuit repeats an operation for sequentially turning on the switches SWa_1 to SWa_m and SWb_1 to SWb_m every predetermined period (for example, 10 msec). As a result, the register VMC_REG is overwritten with the voltage values, which are supplied to the input terminals Vj and V(j+1), every predetermined period.

The communication circuit VMM_C receives the instruction from the cell monitoring unit CMU and the outputs from the other voltage monitoring modules VMM2 to VMMn through the communication input terminal Tin. The communication circuit VMM_C transfers the instruction from the cell monitoring unit CMU to the control circuit VMC_CON. The communication circuit VMM_C transfers the outputs from the voltage monitoring modules VMM2 to VMMn to the cell monitoring unit CMU.

A cell balancing circuit CBj and an external resistor Rj with a cell balancing input terminal VBj interposed therebetween are coupled between the input terminal Vj and the input terminal V(j+1). When the cell balancing circuit CBj turns on, an electrical conduction is established between the input terminal Vj and the input terminal V(j+1). The control circuit VMC_CON controls turning on/off of the cell balancing circuits CB1 to CBm, thereby selectively discharging the battery cells EC1 to ECm.

Referring next to FIG. 1, the operation of the voltage monitoring system VMS will be described. First, an output voltage monitoring operation of each battery cell will be described. The voltage monitoring system VMS starts the output voltage monitoring operation of each battery cell according to a voltage monitoring operation start instruction from the cell monitoring unit CMU. For example, the engine control unit ECU detects the power-on of the electric vehicle, and issues an instruction for activating the voltage monitoring system VMS to the battery management unit BMU. The battery management unit BMU issues an instruction for activating the voltage monitoring modules VMM1 to VMMn to the cell monitoring unit CMU according to the instruction for activating the voltage monitoring system VMS. The cell monitoring unit CMU issues the voltage monitoring operation start instruction to the voltage monitoring modules VMM1 to VMMn according to the instruction for activating the voltage monitoring modules VMM1 to VMMn.

The operation of the voltage monitoring modules VMM1 to VMMn will be described with reference to FIG. 3. The voltage monitoring modules VMM1 to VMMn having received the voltage monitoring operation start instruction perform a similar operation. Accordingly, the operation of the voltage monitoring module VMM1 will be described below as a typical example. The voltage monitoring module VMM1 starts the voltage monitoring operation according to the voltage monitoring operation start instruction from the cell monitoring unit CMU. Specifically, the communication circuit VMM_C transfers the voltage monitoring operation start instruction from the cell monitoring unit CMU to the control circuit VMC_CON of the voltage measurement circuit VMC. The control circuit VMC_CON turns on the switches SWa_j and SWb_j according to the voltage monitoring operation start instruction. This allows each of the input terminals Vj and V_(j+1) to be coupled to the A/D converter VMC_ADC. The A/D converter VMC_ADC converts the magnitude of the voltage supplied to each of the coupled input terminals Vj and V_(j+1) into a voltage value which is a digital value, and writes the voltage value into the register VMC_REG.

In this example, the control circuit VMC_CON sequentially turns on the switches SWa_1 to SWa_m and SWb_1 to SWb_m within a predetermined period. In other words, a switching operation is repeated m times within the predetermined period. The predetermined period is 10 msec, for example. In this case, the voltage monitoring module VMM1 measures the values of the voltages respectively supplied to the input terminals Vj and V_(j+1) every predetermined period (10 msec). The register VMC_REG is sequentially overwritten with the values. The voltage monitoring module VMM1 continuously performs the above-mentioned voltage monitoring operation, unless the voltage monitoring module VMM1 receives another instruction from the cell monitoring unit CMU.

In the case of referring to the value of the output voltage of each battery cell to control the electric vehicle, the cell monitoring unit CMU issues a voltage value output instruction to the voltage monitoring module VMM1 according to the instruction from the battery management unit BMU. The voltage monitoring module VMM1 outputs a voltage value of a designated input terminal to the cell monitoring unit CMU according to the voltage value output instruction. Specifically, the communication circuit VMM_C transfers the voltage value output instruction from the cell monitoring unit CMU to the control circuit VMC_CON of the voltage measurement circuit VMC. The control circuit VMC_CON issues an output instruction to the register VMC_REG according to the voltage value output instruction. In this case, the control circuit VMC_CON designates, in the register VMC_REG, which of the voltage values of the input terminals is to be output. The register VMC_REG outputs the voltage value of the input terminal, which is designated upon reception of the output instruction, to the cell monitoring unit CMU through the communication circuit VMM_C according to the output instruction from the control circuit VMC_CON.

The cell monitoring unit CMU calculates the output voltage of the battery cell ECj from the voltage values of the input terminals Vj and V(j+1) received from the voltage monitoring module VMM1. For example, the cell monitoring unit CMU can calculate the output voltage of the battery cell EC1 from the difference between the voltage of the input terminal V1 and the voltage of the input terminal V2. After that, the cell monitoring unit CMU notifies the battery management unit BMU of the calculated output voltage of the battery cell in response to a request from the battery management unit BMU.

When the electric vehicle is powered off, the engine control unit ECU detects the power-off of the electric vehicle and issues an instruction for stopping the voltage monitoring system VMS to the battery management unit BMU. The battery management unit BMU issues an instruction for stopping the voltage monitoring modules VMM1 to VMMn to the cell monitoring unit CMU according to the instruction for stopping the voltage monitoring system VMS. The cell monitoring unit CMU issues a voltage monitoring operation stop instruction to each of the voltage monitoring modules VMM1 to VMMn according to the instruction for stopping the voltage monitoring modules VMM1 to VMMn. The voltage monitoring module VMM1 stops the voltage monitoring operation according to the voltage monitoring operation stop instruction from the cell monitoring unit CMU. Specifically, the communication circuit VMM_C transfers the voltage monitoring operation stop instruction from the cell monitoring unit CMU to the control circuit VMC_CON of the voltage measurement circuit VMC. The control circuit VMC_CON turns off all the switches SWa_1 to SWa_m and SWb_1 to SWb_m according to the voltage monitoring operation stop instruction. As a result, the voltage monitoring operation is stopped.

The voltage monitoring operation of each battery cell has been described above. However, since the voltage monitoring system VMS is mounted on an electric vehicle, for example, the voltage monitoring system VMS needs to operate according to the status of use of an electric vehicle or the like. Accordingly, the operation of the voltage monitoring system VMS according to the status of use of an electric vehicle will be described below.

To continuously use an electric vehicle, the assembled battery assy needs to be charged at an electricity station or the like. In the case of charging the assembled battery assy, the engine control unit ECU detects a manipulation of an operator, such as a connection of a charging plug, and issues a charging instruction for charging the assembled battery assy to the battery management unit BMU. The battery management unit BMU opens relays REL1 and REL2 according to the charging instruction from the engine control unit ECU. This allows the assembled battery assy and an inverter INV to be electrically disconnected. In this state, an external charging voltage CHARGE is supplied to the assembled battery assy through a charging plug, for example, to thereby charge the assembled battery assy.

It is generally known that overcharging or overdischarging of a secondary battery such as a battery cell leads to shortening of the lifetime of the battery cell. In a configuration in which a plurality of battery cells is connected in series as in the assembled battery assy, even when the battery cells are caused to perform similar charging and discharging operations, a variation in voltage or the like occurs due to manufacturing variations of the battery cells. If the charging and discharging operations of the assembled battery assy are repeated when such a variation is occurring, a deterioration, overcharge, or overdischarge of only a specific battery cell occurs. This results in shortening of the lifetime of the entire assembled battery assy and occurrence of a failure. For this reason, in the case of using battery cells connected in series, it is necessary to maintain a balance of the voltages of the battery cells (so-called cell balance).

The operation of each battery cell of the voltage monitoring system VMS during charging at an electricity station or the like will be described below. The output voltage monitoring operation of each battery cell and the method for calculating the output voltage of each battery cell are similar to those described above, so the description thereof is omitted as needed.

First, the battery management unit BMU issues an output voltage measurement instruction to the cell monitoring unit CMU according to the charging instruction from the engine control unit ECU. The cell monitoring unit CMU calculates output voltages of all battery cells constituting the assembled battery assy according to the output voltage measurement instruction from the battery management unit BMU, and notifies the battery management unit BMU of the calculated output voltages. The battery management unit BMU specifies a battery cell having a lowest output voltage in the assembled battery assy. For simplification of the explanation, assume herein that the battery cell EC1 of the battery module EM1 is a battery cell having a lowest output voltage in the assembled battery assy.

After that, the battery management unit BMU issues a cell balancing operation instruction to the cell monitoring unit CMU. The cell monitoring unit CMU issues a discharging instruction to each of the voltage monitoring modules VMM1 to VMMn according to the cell balancing operation instruction. The operation of the voltage monitoring module VMM1 will be described below as a typical example. In the voltage monitoring module VMM1, the control circuit VMC_CON of the voltage measurement circuit VMC receives the discharging instruction through the communication circuit VMM_C. The control circuit VMC_CON turns on the cell balancing circuits CB2 to CBm according to the discharging instruction. This allows the battery cells EC2 to ECm to be discharged.

The cell monitoring unit CMU sequentially calculates the output voltage values of the battery cells EC2 to ECm during discharging. When the output voltage of each battery cell drops to the output voltage of the battery cell EC1, the cell monitoring unit CMU issues a discharging stop instruction for stopping the discharging operation of the corresponding battery cell. The case where the output voltage of the battery cell EC2 drops to the output voltage of the battery cell EC1 due to discharging will be described below. First, the cell monitoring unit CMU detects that the output voltage of the battery cell EC2 drops to the output voltage of the battery cell EC1. Then, the cell monitoring unit CMU issues an instruction for stopping discharging of the battery cell EC2 to the voltage monitoring module VMM1.

The control circuit VMC_CON of the voltage monitoring module VMM1 receives the instruction for stopping discharging of the battery cell EC2, through the communication circuit VMM_C. The control circuit VMC_CON turns off the cell balancing circuit CB2 according to the instruction for stopping discharging of the battery cell EC2. As a result, the discharging of the battery cell EC2 is stopped and the output voltage of the battery cell EC2 becomes equal to the output voltage of the battery cell EC1. The cell monitoring unit CMU performs a similar operation to thereby allow the output voltages of the battery cells EC3 to ECm of the battery module EM1 and the output voltages of the battery cells of the battery modules EM2 to EMn to be equal to the output voltage of the battery cell EC1. Thus, the output voltages of the battery cells of the battery modules EM2 to EMn are equalized, and the cell monitoring unit CMU terminates the cell balancing operation. The cell monitoring unit CMU notifies the battery management unit BMU of the termination of the cell balancing operation.

In response to the notification of the termination of the cell balancing operation, the battery management unit BMU issues a charging start instruction to a power receiving unit (not shown) which is connected to a charging plug. As a result, the external charging voltage CHARGE is supplied to the assembled battery assy and charging of the assembled battery assy is started.

The cell monitoring unit CMU monitors the output voltage of each battery cell during charging. When the output voltage of any of the battery cells reaches a charging upper limit voltage, the cell monitoring unit CMU notifies the battery management unit BMU of an overcharge warning. The battery management unit BMU issues a charging stop instruction to the power receiving unit in response to the notification of the overcharge warning. As a result, the supply of the external charging voltage CHARGE is interrupted and the charging is stopped. To reliably prevent occurrence of overcharge of each battery cell, the charging upper limit voltage is desirably set to a voltage value which is smaller than a threshold voltage level at the time of overcharge and which has a sufficient margin from a voltage level at the time of overcharge.

Charging characteristics of each battery cell of the battery modules EM1 to EMn vary. Accordingly, a variation occurs in the voltage value of each battery cell after charging. Thus, the cell monitoring unit CMU measures the output voltage of each battery cell so as to recognize a variation in the voltage value of each battery cell. Then, the cell monitoring unit CMU determines whether the variation in the output voltage of each battery cell falls within a prescribed range, and notifies the battery management unit BMU of the determination result.

When the variation in the output voltage of each battery cell does not fall within the prescribed range, the battery management unit BMU instructs the cell monitoring unit CMU to start the cell balancing operation. After completion of the cell balancing operation, the battery management unit BMU instructs the power receiving unit to start charging. On the other hand, when the variation in the output voltage of each battery cell falls within the prescribed range, the battery management unit BMU notifies the engine control unit ECU of the completion of charging. The engine control unit ECU displays the completion of charging of the assembled battery assy on a display device provided at a dashboard, for example. As described above, the voltage monitoring system VMS monitors the output voltage of each battery cell, thereby preventing an overcharge and enabling charging of the assembled battery assy up to a fully charged state while maintaining an excellent cell balance.

Next, the case of accelerating the electric vehicle will be described. In the case of accelerating the electric vehicle, the engine control unit ECU detects a manipulation of an operator, such as depression of an accelerator pedal, and issues an acceleration instruction for accelerating the electric vehicle to each of the inverter INV and the battery management unit BMU. The operation mode of the inverter INV is switched to a DC-to-AC conversion mode according to the acceleration instruction from the engine control unit ECU. The battery management unit BMU closes the relays REL1 and REL2 according to the acceleration instruction from the engine control unit ECU. As a result, a DC voltage is supplied from the assembled battery assy to the inverter INV. The inverter INV converts the DC voltage into an AC voltage and supplies the AC voltage to a motor generator MG. The motor generator MG receives the AC voltage to thereby generate a driving force. The driving force generated by the motor generator MG is transmitted to drive wheels through drive shafts or the like, thereby accelerating the electric vehicle.

In the case of accelerating the electric vehicle, electric power stored in each battery cell is consumed and the output voltage of each battery cell decreases. Accordingly, it is necessary to take measures for preventing an overdischarge of each battery cell. Thus, the voltage monitoring system VMS constantly monitors the output voltage of each battery cell during traveling. For example, when the voltage of any of the battery cells is lower than a warning level voltage, the cell monitoring unit CMU issues a voltage drop warning to the battery management unit BMU. The battery management unit BMU issues a warning of a decrease in charge remaining amount of the assembled battery assy to the engine control unit ECU according to the voltage drop warning. The engine control unit ECU displays the warning of the decrease in charge remaining amount of the assembled battery assy on a display device provided at a dashboard, for example, and informs the operator that there is a possibility of occurrence of an overdischarge in a battery cell. This allows the voltage monitoring system VMS to prompt the operator to take measures, such as stopping of traveling, to prevent an overdischarge.

If the warning of the decrease in charge remaining amount of the assembled battery assy is neglected and traveling is continued thereafter, the output voltage of each battery cell further decreases. Accordingly, to prevent an overdischarge of each battery cell, it is necessary to stop discharging of each battery cell. For example, when the voltage of any of the battery cells is lower than an emergency stop level voltage, the cell monitoring unit CMU issues an emergency stop warning to the battery management unit BMU. To reliably prevent occurrence of overdischarge of each battery cell, the emergency stop level voltage is desirably set to a voltage value which is larger than a threshold voltage level at the time of overdischarge and which has a sufficient margin from a voltage level at the time of overdischarge.

The battery management unit BMU activates an emergency stop operation according to the emergency stop warning from the cell monitoring unit CMU. Specifically, the battery management unit BMU opens the relays REL1 and REL2 to interrupt the power supply from the assembled battery assy to the inverter INV. This results in stopping the drop of the output voltage of each battery cell. The battery management unit BMU notifies the engine control unit ECU of execution of the emergency stop operation. The engine control unit ECU displays the activation of the emergency stop operation on a display device provided at a dashboard, for example. This reliably prevents occurrence of an overdischarge of each battery cell.

Next, the case of decelerating the electric vehicle will be described. In the case of decelerating the electric vehicle, the engine control unit ECU detects a manipulation of the operator, such as depression of a brake pedal, and issues a deceleration instruction for decelerating the electric vehicle to each of the inverter INV and the battery management unit BMU. The operation mode of the inverter INV is switched to an AC-to-DC conversion mode according to the deceleration instruction from the engine control unit ECU. The battery management unit BMU closes the relays REL1 and REL2 according to the deceleration instruction from the engine control unit ECU. The motor generator MG generates power by torque of tires which is transmitted through drive shafts or the like. A rotational resistance generated by the power generation is transmitted as a braking force to the drive wheels through drive shafts or the like. This results in decelerating the electric vehicle. This braking method is generally referred to as a regenerative brake operation. An AC voltage generated by the regenerative brake operation is supplied to the inverter INV. The inverter INV converts the AC voltage from the motor generator MG into a DC voltage and supplies the DC voltage to the assembled battery assy. This allows the assembled battery assy to be charged with the voltage recovered by the regenerative brake operation.

The assembled battery assy is charged during the regenerative brake operation, so that the output voltage of each battery cell rises. Accordingly, it is necessary to take countermeasures for preventing an overcharge of each battery cell. Thus, the voltage monitoring system VMS constantly monitors the output voltage of each battery cell during traveling. The cell monitoring unit CMU determines whether the output voltage of each battery cell at the time of starting the regenerative brake operation is equal to or lower than the charging upper limit voltage. When there is a battery cell having an output voltage higher than the charging upper limit voltage, the cell monitoring unit CMU issues an overcharge warning to the battery management unit BMU. The battery management unit BMU opens the relays REL and REL2 according to the overcharge warning to prevent the assembled battery assy from being charged.

Also during the charging by the regenerative brake operation, the cell monitoring unit CMU continuously monitors the output voltage of each battery cell. When a battery cell having an output voltage having reached the charging upper limit voltage is found, the cell monitoring unit CMU issues an overcharge warning to the battery management unit BMU. The battery management unit BMU opens the relays REL1 and REL2 according to the overcharge warning to prevent the assembled battery assy from being charged. This makes it possible to prevent the assembled battery assy from being overcharged.

The operation of the voltage monitoring system VMS has described above on the premise that the voltage of each battery cell can be detected normally. In practice, however, the output voltage of each battery cell cannot be detected normally in some cases. For example, if a line between the voltage monitoring modules VMM1 to VMMn and the assembled battery assy is disconnected, a voltage at a disconnected portion abnormally drops or abnormally rises. This makes it impossible for the cell monitoring unit CMU to perform a normal voltage calculation. The occurrence of such a disconnection makes is impossible to monitor the output voltage of each battery cell, which is an object of the voltage monitoring system VMS. Therefore, there is a need to detect a disconnection failure.

Thus, the cell monitoring unit CMU preliminarily stores an appropriate range of output voltage values. When the calculated output voltage of each battery cell falls out of the appropriate range, the cell monitoring unit CMU determines that a disconnection failure has occurred. Then, the cell monitoring unit CMU notifies the battery management unit BMU of the occurrence of the disconnection failure. In response to the notification of the occurrence of the disconnection failure, the battery management unit BMU opens the relays REL1 and REL2 and disconnects the connection between the inverter INV and the assembled battery assy. This prevents a further failure from occurring in the system. Further, the battery management unit BMU notifies the engine control unit ECU of the occurrence of the disconnection failure. The engine control unit ECU displays the occurrence of the disconnection failure on a display device provided at a dashboard, for example, and informs the operator of the occurrence of the failure. As described above, the voltage monitoring system VMS can also detect the occurrence of the disconnection failure.

Note that the configuration and operation of the voltage monitoring system VMS are illustrated by way of example only. Accordingly, the cell monitoring unit CMU and the battery management unit BMU can be integrated into one circuit block, for example. Further, a part or the whole of the functions shared by the cell monitoring unit CMU and the battery management unit BMU can be replaced with each other. Furthermore, the cell monitoring unit CMU, the battery management unit BMU, and the engine control unit ECU can be integrated into one circuit block. The engine control unit ECU enables replacement of a part or the whole of the functions of the cell monitoring unit CMU and the battery management unit BMU.

First Embodiment

Figure 4:
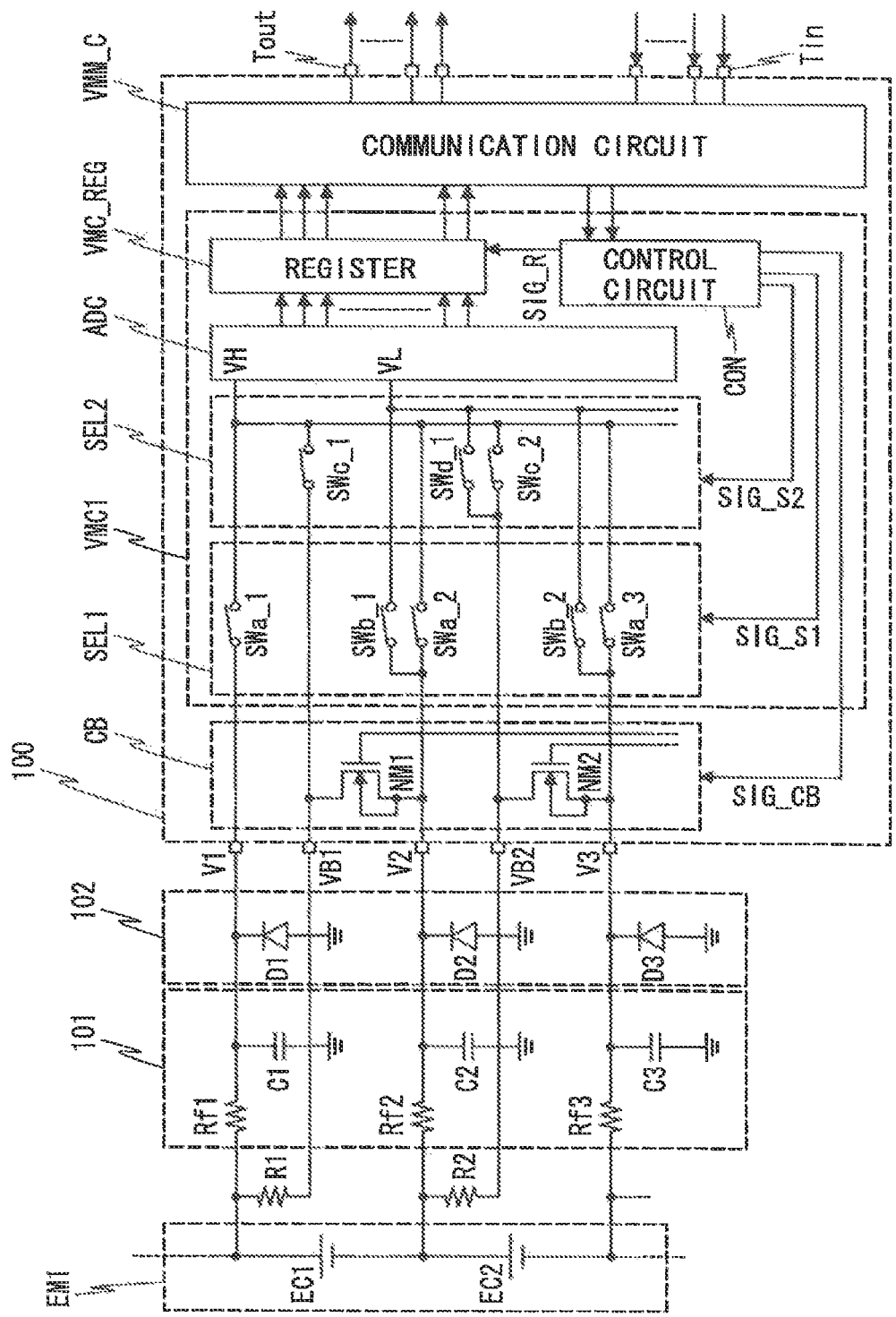
FIG. 4 is a circuit diagram showing a configuration of a main part of the voltage monitoring module 100 according to a first embodiment.

A voltage monitoring module 100 according to a first embodiment will be described below. The voltage monitoring module 100 corresponds to each of the voltage monitoring modules VMM1 to VMMn shown in FIGS. 1 to 3. FIG. 4 is a circuit diagram showing a configuration of a main part of the voltage monitoring module 100 according to the first embodiment. For simplification of the explanation, FIG. 4 illustrates the components necessary to understand the configuration and operation of the voltage monitoring module 100. Specifically, the power supply circuit VMM_S is omitted in FIG. 4, and FIG. 4 illustrates only the circuit elements and circuit blocks associated with the input terminals V1 to V3, the cell balancing input terminals VB1 and VB2.

As compared with the voltage monitoring module VMM1 shown in FIG. 3, the voltage monitoring module 100 has a configuration in which a selection circuit SEL2 is added. A filter circuit 101 and a protection circuit 102 are interposed between the voltage monitoring module 100 and the battery module EM1.

The filter circuit 101 includes filter resistors Rf1 to Rfm and filter capacitors C1 to Cm. For simplification of the explanation, FIG. 4 illustrates only the filter resistors Rf1 to Rf3 and filter capacitors C1 to C3. The high-voltage-side terminal of the battery cell EC1 is coupled to the input terminal V1 through the filter resistor Rf1. The low-voltage-side terminal of the battery cell EC1 and the high-voltage-side terminal of the battery cell EC2 are coupled to the input terminal V2 through the filter resistor Rf2. The low-voltage-side terminal of the battery cell EC2 is coupled to the input terminal V3 through the filter resistor Rf3. The filter capacitors C1 to C3 are coupled between the input terminals V1 to V3 and a ground, respectively. Thus, the filter circuit 101 functions as an RC filter, thereby preventing high frequency noise from flowing into the voltage monitoring module 100.

The protection circuit 102 includes protection diodes D1 to Dm. For simplification of the explanation, FIG. 4 illustrates only the protection diodes D1 to D3. The protection diodes D1 to D3 are coupled between the input terminals V1 to V3 and the ground, respectively. Thus, breakdowns of the protection diodes D1 to D3 occur when the overvoltage is applied to the input terminals V1 to V3, thereby preventing overvoltage from being applied to the voltage monitoring module 100.

A cell balancing circuit CB includes N-channel transistors NM1 to NMm. The N-channel transistors NM1 to NMm correspond to the cell balancing circuits CB1 to CBm in FIG. 3, respectively. The drains of the N-channel transistors NM1 to NMm are coupled to the cell balancing input terminals VB1 to VBm, respectively. The sources of the N-channel transistors NM1 to NMm are coupled to the input terminals V2 to V(m+1), respectively. The gates of the N-channel transistors NM1 to NMm are coupled to a control circuit CON. The N-channel transistors NM1 to NMm are turned on/off according to a control signal SIG_CB from the control circuit CON.

A selection circuit SEL1 corresponds to the selection circuit VMC_SEL in FIG. 3. Switches SWa_1 to SWa_m and SWb_1 to SWb_m in the selection circuit SEL1 are turned on/off according to a control signal SIG_S1 from the control circuit CON. The selection circuit SEL1 performs the same operation as the selection circuit VMC_SEL and measures a normal measurement voltage of the battery cell. The other components of the selection circuit SEL1 are similar to those of the selection circuit VMC_SEL, so the description thereof is omitted.

The selection circuit SEL2 includes switches SWc_1 to SWc_m and SWd_1 to SWd_m. One ends of the switches SWc_1 to SWc_m are coupled to the cell balancing input terminals VB1 to VBm, respectively. The other ends of the switches SWc_1 to SWc_m are coupled to an A/D converter ADC and output a high-voltage-side voltage VH to the A/D converter ADC. One ends of the switches SWd_1 to SWd_(m−1) are coupled to the cell balancing input terminals VB2 to VBm, respectively. One end of the switch SWd_m is coupled to the input terminal V(m+1). In other words, the switch SWd_m uses the input terminal V(m+1) as the cell balancing input terminal. The other ends of the switches SWd_1 to SWd_m are coupled to the A/D converter ADC and output a low-voltage-side voltage VL to the A/D converter ADC.

Assuming that j is an integer ranging from 1 to m, the switches SWc_j and SWd_j are simultaneously turned on in the case of measuring a normal measurement voltage of the battery cell ECj. Thus, a voltage from the high-voltage-side terminal of the battery cell ECj is supplied to the A/D converter ADC as the high-voltage-side voltage VH. Similarly, a voltage from the low-voltage-side terminal of the battery cell ECj is supplied to the A/D converter ADC as the low-voltage-side voltage VL. The A/D converter ADC corresponds to the A/D converter VMC_ADC in FIG. 3.

The control circuit CON corresponds to the control circuit VMC_CON in FIG. 3. The control circuit CON controls an operation of each of the N-channel transistors NM1 to NMm, the selection circuits SEL1 and SEL2 by the control signals SIG_CB, SIG_S1, and SIG_S2, respectively.

A register VMC_REG and a communication circuit VMM_C are similar to those in FIG. 3, so the description thereof is omitted. The other components of the voltage monitoring module 100 are similar to those of the voltage monitoring module VMM1, so the description thereof is omitted.

Figure 5:
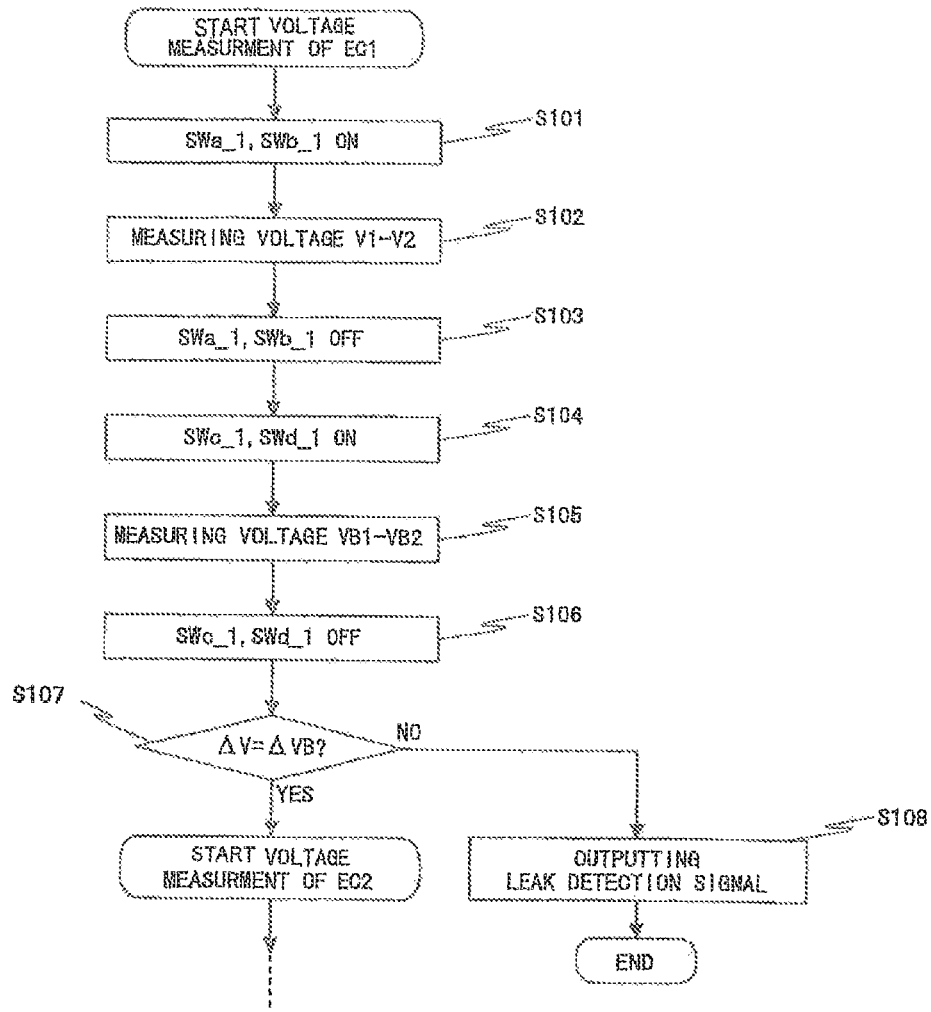
FIG. 5 is a flow chart showing the operation of the voltage monitoring module 100.

Next, the operation of the voltage monitoring module 100 is described. Hereinafter, the operation in the case of measuring a voltage of the battery cell EC1 is described as a typical example. FIG. 5 is a flow chart showing the operation of the voltage monitoring module 100.

First, the control circuit CON turns on the switches SWa_1 and SWb_1 by the control signal SIG_S1 (step S101). In this state, a voltage between the input terminal V1 and the input terminal V2 is measured (step S102).

Specifically, the A/D converter ADC refers to voltage values of the input terminal V1 and input terminal V2, and converts referred voltages into voltage values V1_d and V2_d which are digital values, respectively. The A/D converter ADC writes the voltage values V1_d and V2_d into the resister VMC_REG. The resister VMC_REG outputs the voltage values V1_d and V2_d to the cell monitoring unit CMU shown in FIG. 1 according to a control signal SIG_R from the control circuit CON. The cell monitoring unit CMU calculates the normal measurement voltage ΔV of the battery cell EC1 by subtracting the voltage value V2_d from the voltage value V1_d.

Figure 6:
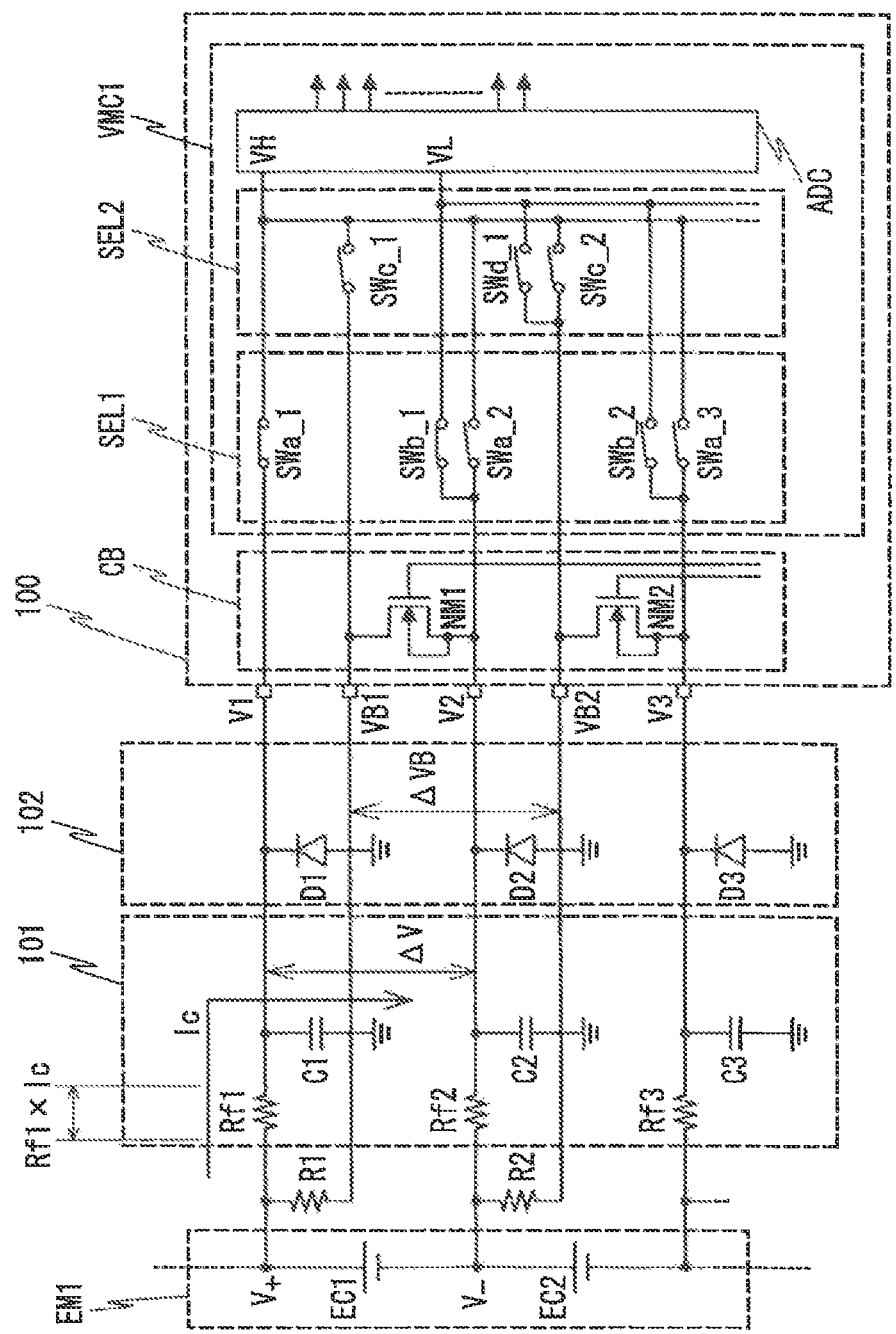
FIG. 6 is a circuit diagram showing voltage measurement of the voltage monitoring module 100 when a leak current flows through the filter capacitor C1.

The case where a leak current Ic flows through the filter capacitor C1 due to malfunction of the filter capacitor C1 is considered. FIG. 6 is a circuit diagram showing voltage measurement of the voltage monitoring module 100 when a leak current flows through the filter capacitor C1. When the leak current Ic flows, a voltage drop occurs at the filter resistor Rf1. The voltage drop VRf1 generated by the filter resistor Rf1 is Rf1×Ic. When the voltage of the high-voltage-side terminal of the battery cell EC1 is $V_+$, and the low-voltage-side terminal of the battery cell EC1 is $V_-$, the voltage of the input terminal V1 can be expressed by the following expression (6).

$$V1 = V_+ - Rf1 \times Ic \quad (6)$$

Therefore, the normal measurement voltage ΔV can be expressed by the following expression (7).

$$\Delta V = V_+ - V_- - Rf1 \times Ic \quad (7)$$

Meanwhile, a voltage V_EC1 of the battery cell EC1 can be expressed by the following expression (8).

$$V\_EC1 = V_+ - V_- \quad (8)$$

Therefore, the normal measurement voltage ΔV becomes lower by Rf1×Ic than a voltage when there is no leak current. As a result, the cell monitoring unit CMU calculates the normal measurement voltage ΔV lower by Rf1×Ic than the voltage V_EC1 which is an original voltage of the battery cell EC1.

Figure 7:
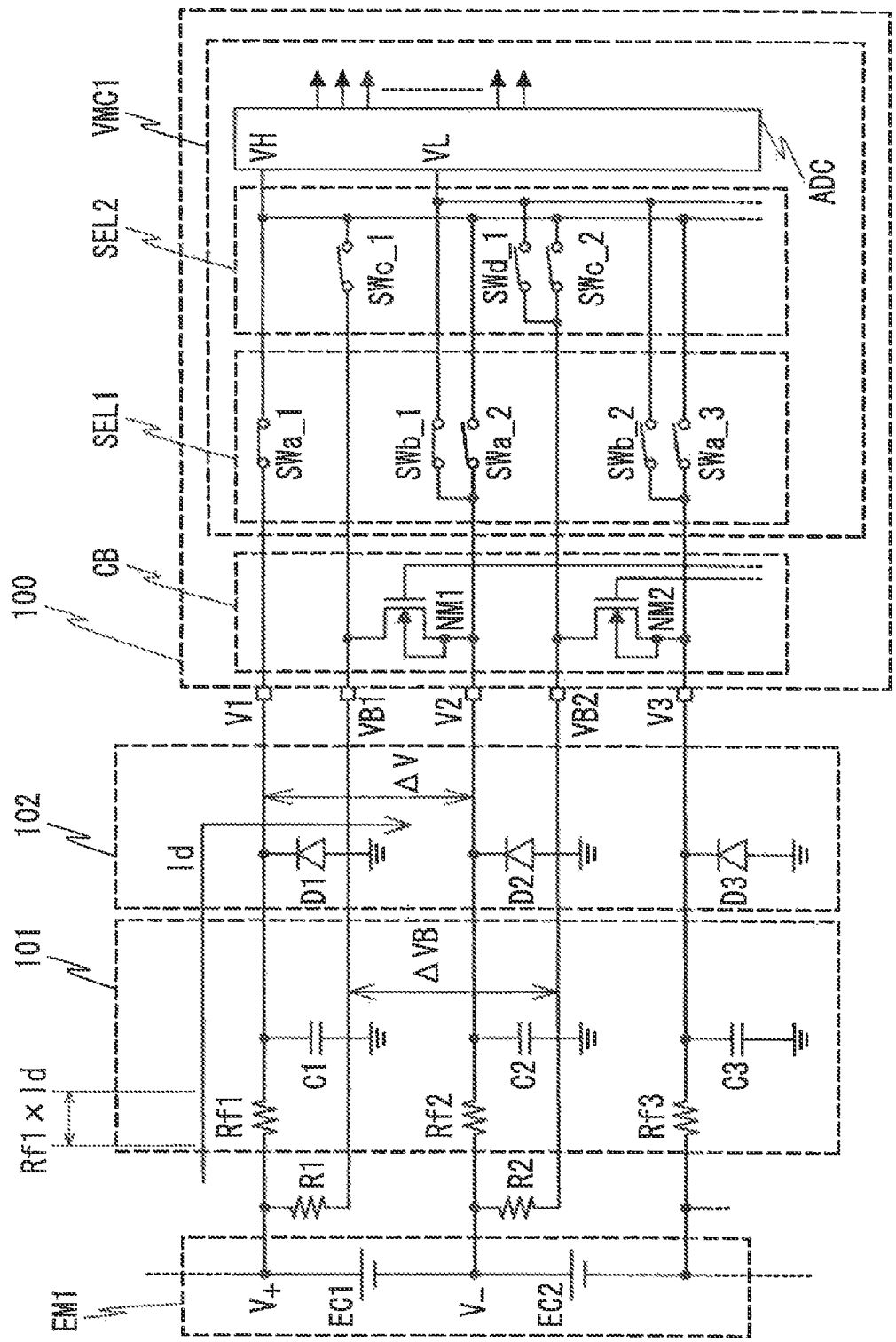
FIG. 7 is a circuit diagram showing voltage measurement of the voltage monitoring module 100 when a leak current flows through the protection diode D1.

Similarly, the case where a leak current Id flows through the protection diode D1 due to malfunction of the protection diode D1 is considered. FIG. 7 is a circuit diagram showing voltage measurement of the voltage monitoring module 100 when a leak current flows through the protection diode D1. As shown in FIG. 7, a voltage drop occurs at the filter resistor Rf1 when the leak current Id flows. The voltage drop VRf1 generated by the filter resistor Rf1 is Rf1×Id. Thus, the voltage of the input terminal V1 can be expressed by the following expression (9).

$$V1 = V_+ - Rf1 \times Id \quad (9)$$

Therefore, the normal measurement voltage ΔV can be expressed by the following expression (10).

$$\Delta V = V_+ - V_- - Rf1 \times Id \quad (10)$$

Therefore, the normal measurement voltage ΔV becomes lower by Rf1×Id than a voltage when there is no leak current. As a result, the cell monitoring unit CMU calculates the normal measurement voltage ΔV lower by Rf1×Id than the voltage V_EC1 which is an original voltage of the battery cell EC1.

In sum, when the leak current flows through an element of an external circuit coupled to the input terminal, the cell monitoring unit CMU calculates the normal measurement voltage lower than the original voltage of the battery cell.

Subsequently, the control circuit CON turns off the switches SWa_1 and SWb_1 by the control signal SIG_S1 (step S103). After that, the control circuit CON turns on the switches SWc_1 and SWd_1 by the control signal SIG_S2 (step S104). In this state, a voltage between the cell balancing input terminal VB1 and the cell balancing input terminal VB2 is measured (step S105).

Specifically, the A/D converter ADC refers to the high-voltage-side voltage VH from the cell balancing input terminal VB1 and the low-voltage-side voltage VL from the cell balancing input terminal VB2, and converts referred voltages into voltage values VB1_d and VB2_d which are digital values, respectively. The A/D converter ADC writes the voltage values VB1_d and VB2_d into the resister VMC_REG. The resister VMC_REG outputs the voltage values VB1_d and VB2_d to the cell monitoring unit CMU shown in FIG. 1 according to the control signal SIG_R from the control circuit CON. The cell monitoring unit CMU calculates a redundant measurement voltage ΔVB of the battery cell EC1 by subtracting the voltage value VB2_d from the voltage value VB1_d. After that, the switches SWc_1 and SWd_1 are turned off (step S106).

Subsequently, the cell monitoring unit CMU judges whether the leak current occurs. The cell monitoring unit CMU compares the normal measurement voltage ΔV with the redundant measurement voltage ΔVB, and judges whether difference between the normal measurement voltage ΔV and the redundant measurement voltage ΔVB of the battery cell EC1 is equal to or greater than a predetermined value (step S107). As described above, the normal measurement voltage ΔV becomes lower when the leak current occurs. Therefore, when the normal measurement voltage ΔV is different from the redundant measurement voltage ΔVB, the leak current can be detected.

When the difference between the normal measurement voltage ΔV and the redundant measurement voltage ΔVB of the battery cell EC1 is equal to or greater than the predetermined value, a leak detection signal is output to the battery management unit BMU (step S108). The battery management unit BMU issues a voltage monitoring malfunction warning to the engine control unit ECU based on the leak detection signal. The engine control unit ECU notifies an operator of the occurrence of the voltage monitoring malfunction of the battery cell EC1 by illustrating the occurrence of the voltage monitoring malfunction on the display device or the like provided at a dashboard. Therefore, the operator can take measures to stop running or for troubleshooting.

Further, the engine control unit ECU can take measures to prevent the battery cell from being damaged according to the occurrence of the voltage monitoring malfunction of the battery cell. Specifically, when the malfunction is detected during electric charge, it is impossible to accurately measure the voltage of the battery cell. Therefore, the battery cell the voltage of which cannot be accurately measured may be overcharged in the case of being directly charged. In this case, the engine control unit ECU can prevent the occurrence of the overcharge by interrupting the supply of an external charging voltage CHARGE.

Meanwhile, when the difference between the normal measurement voltage ΔV and the redundant measurement voltage ΔVB of the battery cell EC1 is lower than the predetermined value, the voltage measurement of the battery cell EC1 is finished. After that, the voltage measurement of the battery cell EC2 is started in the same procedure as the above-mentioned steps S101 to S107. After that, voltages of the battery cells EC3 to ECm are measured in sequence.

As described above, according to the configuration, it is possible to provide the voltage monitoring module capable of detecting the voltage monitoring malfunction of the battery cell due to the occurrence of the leak current associated with the voltage monitoring of the battery cell. Further, the voltage monitoring malfunction of the battery cell can be detected without increasing the number of the terminals by changing only a configuration of an inner circuit.

Further, in the voltage monitoring module 100, the voltage measurement of the battery cell is performed using the input terminals V1 to V(m+1) and the cell balancing input terminals VB1 to VBm, so that open/short check of each of the terminals can be simultaneously performed. Furthermore, the voltage measurement of the battery cell is performed by switching the switches of the selection circuits SEL1 and SEL2, so that malfunction of the selection circuits SEL1 and SEL2 can be detected.

In this embodiment, each of the measurement of the normal measurement voltage ΔV and the redundant measurement voltage ΔVB is performed once, the measurement method is not limited to this example. For example, each of the measurement of the normal measurement voltage ΔV and the redundant measurement voltage ΔVB is performed a plurality of times, and the cell monitoring unit CMU may calculate the moving average. In this case, the measurement of the normal measurement voltage ΔV is performed a plurality of times, and the cell monitoring unit CMU calculates an average normal measurement voltage ΔV_ave. The measurement of the redundant measurement voltage ΔVB is performed a plurality of times, and the cell monitoring unit CMU calculates an average redundant measurement voltage ΔVB_ave. Then, as with the step S107, the leak current can be detected by comparing the average normal measurement voltage ΔV_ave with the average redundant measurement voltage ΔVB_ave. In this case, when the value of the normal measurement voltage ΔV or the redundant measurement voltage ΔVB is fluctuated due to noise disturbance, misdetection of the leak current can be prevented.

Second Embodiment

Figure 8:
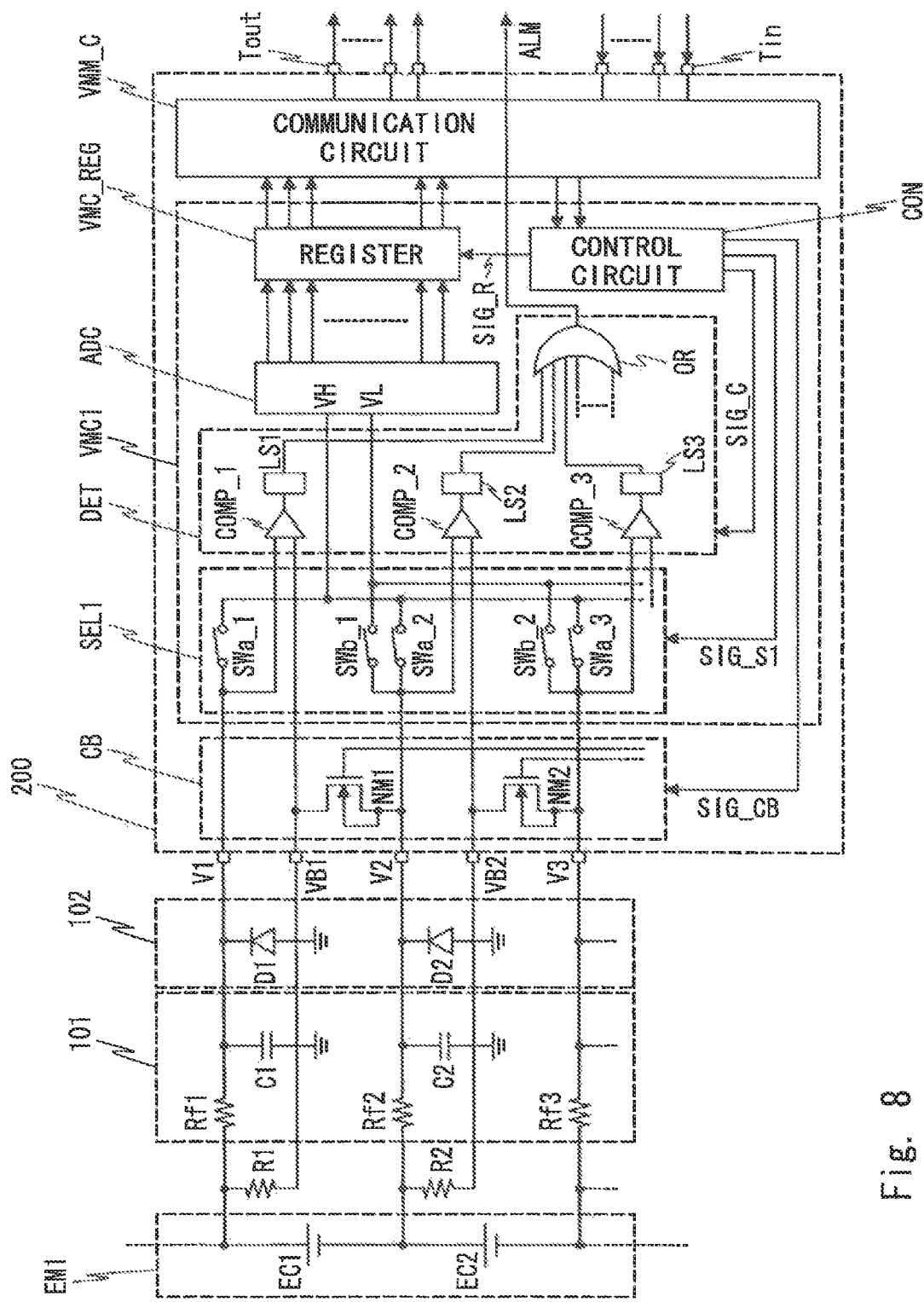
FIG. 8 is a circuit diagram showing a configuration of a main part of the voltage monitoring module 200 according to a second embodiment.

Next, a voltage monitoring module 200 according to a second embodiment will be described below. The voltage monitoring module 200 is a modified example of the voltage monitoring module 100. FIG. 8 is a circuit diagram showing a configuration of a main part of the voltage monitoring module 200 according to the second embodiment. For simplification of the explanation, FIG. 8 illustrates the components necessary to understand the configuration and operation of the voltage monitoring module 200. Specifically, the power supply circuit VMM_S is omitted in FIG. 8, and FIG. 8 illustrates only the circuit elements and circuit blocks associated with the input terminals V1 to V3, the cell balancing input terminals VB1 and VB2.

The voltage monitoring module 200 has a configuration in which the selection circuit SEL2 of the voltage monitoring module 100 is replaced with a detection circuit DET. The detection circuit DET includes offset voltage comparators COMP_1 to COMP_m, level shifters LS1 to Lsm and an OR circuit OR.

The offset voltage comparators COMP_1 to COMP_m compare the voltages of the input terminals V1 to Vm with the voltages of the cell balancing input terminal VB1 to VBm, respectively. An offset voltage Vo is set to each of the offset voltage comparators COMP_1 to COMP_m. Hereinafter, the offset voltage comparator COMP_1 is described as a typical example. The offset voltage comparator COMP_1 outputs High level when a difference between the voltage of the input terminals V1 and the voltage of the cell balancing input terminal VB1 is equal to or greater than the offset voltage Vo. The offset voltage comparator COMP_1 outputs Low level when the difference between the voltage of the input terminals V1 and the voltage of the cell balancing input terminal VB1 is less than the offset voltage Vo. Operations of the offset voltage comparators COMP_2 to COMP_m are the same as that of the offset voltage comparator COMP_1.

The level shifters LS1 to Lsm are coupled between the outputs of the offset voltage comparators COMP_1 to COMP_m and the input of the OR circuit OR, respectively. The level shifters LS1 to Lsm boost the voltage levels of the output signals from the outputs of the offset voltage comparators COMP_1 to COMP_m, respectively.

The OR circuit OR receives output signals from the offset voltage comparators COMP_1 to COMP_m. The output of the OR circuit OR is coupled to the cell monitoring unit CMU. The OR circuit OR outputs a leak detection signal ALM to the cell monitoring unit CMU according to the output signals from the offset voltage comparators COMP_1 to COMP_m. Specifically, Hige level signal is output as the leak detection signal ALM when any of the output signals from the offset voltage comparators COMP_1 to COMP_m is High level.

The other components of the voltage monitoring module 200 are similar to those of the voltage monitoring module 100, so the description thereof is omitted.

Figure 9:
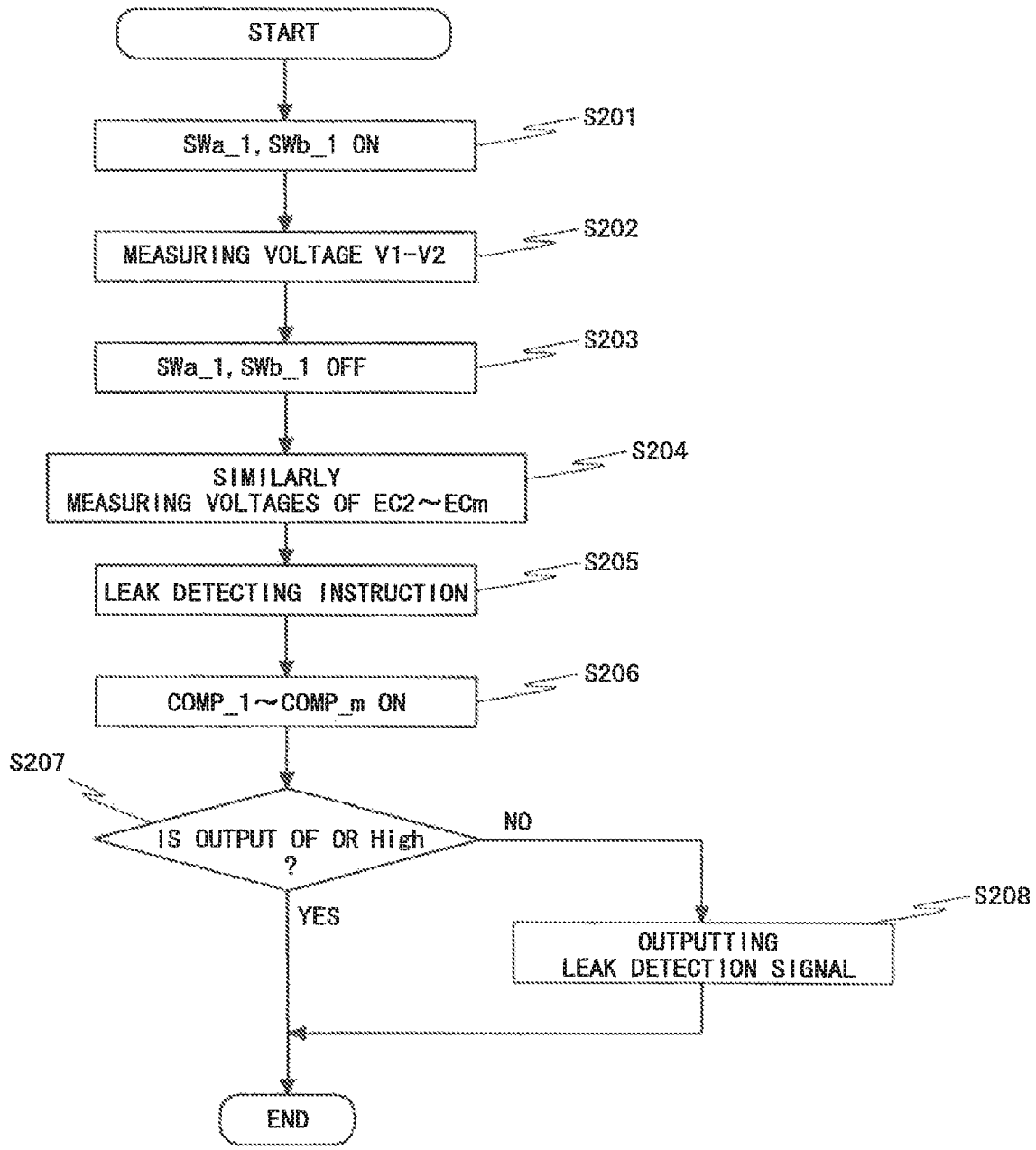
FIG. 9 is a flow chart showing an operation of the voltage monitoring module 200.

Next, an operation of the voltage monitoring module 200 is described. Hereinafter, the operation in the case of measuring a voltage of the battery cell EC1 is described as a typical example. FIG. 9 is a flow chart showing the operation of the voltage monitoring module 200.

Steps S201 to S203 are similar to the steps S101 to S103 of FIG. 5, so the description thereof is omitted. After that, the voltages of the battery cells EC2 to ECm are measured in the same procedure as the step S201 to S203 (step S204).

Subsequently, the cell monitoring unit CMU outputs a leak detecting instruction to the control circuit CON (step S205). The control circuit CON turns on the offset voltage comparators COMP_1 to COMP_m by a control signal SIG_C (step S206). Thus, it is judged whether any of the output signals from the offset voltage comparators COMP_1 to COMP_m is High level, or the output of the OR circuit OR is High (step S207).

Figure 10:
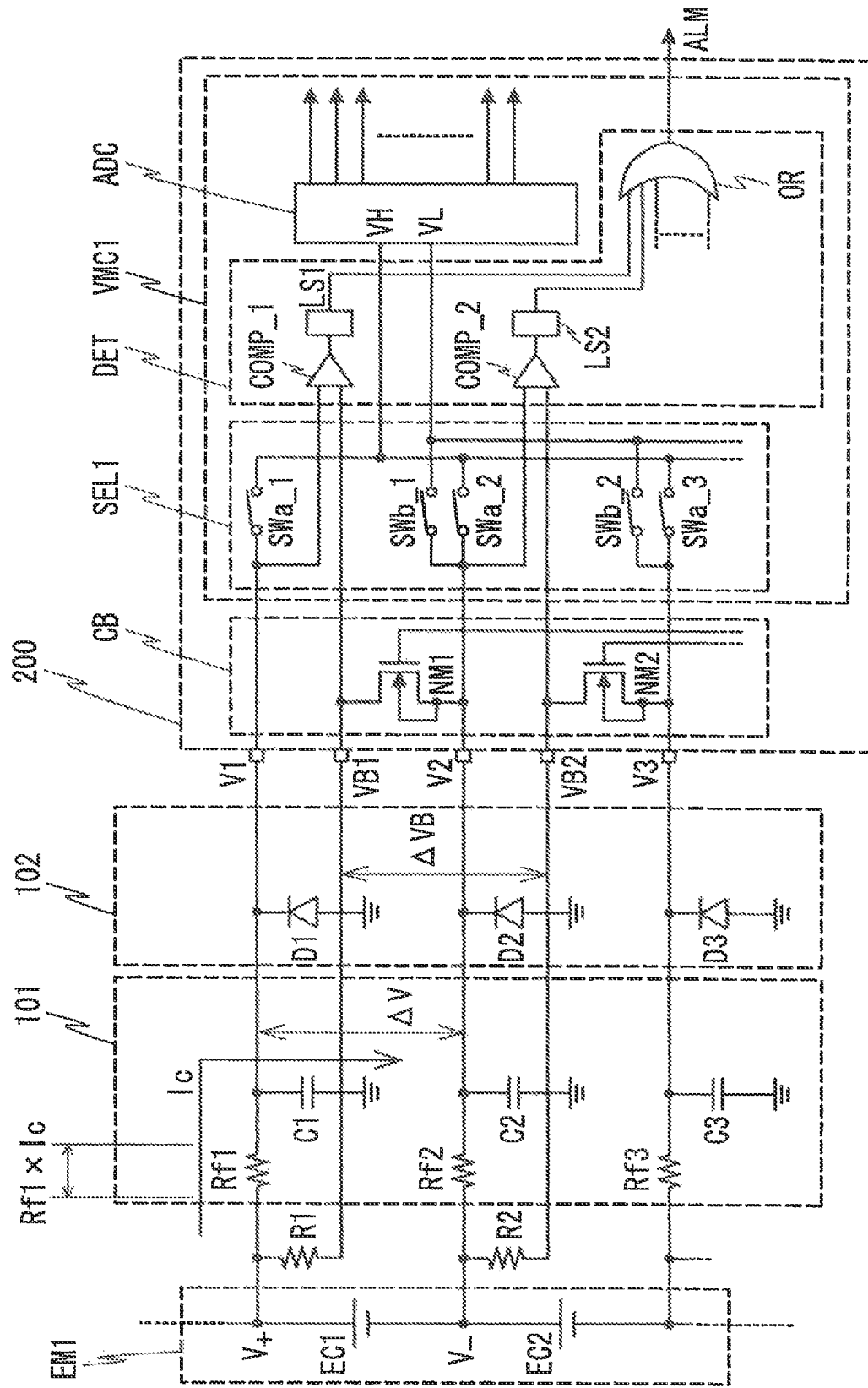
FIG. 10 is a circuit diagram showing voltage measurement of the voltage monitoring module 200 when a leak current flows through the filter capacitor C1.

The case where a leak current Ic flows through the filter capacitor C1 due to malfunction of the filter capacitor C1 is considered. FIG. 10 is a circuit diagram showing voltage measurement of the voltage monitoring module 200 when a leak current flows through the filter capacitor C1. When the leak current Ic flows, a voltage drop occurs at a filter resistor Rf1. The voltage drop VRf1 generated by the filter resistor Rf1 is Rf1×Ic. Thus, the voltage of the input terminal V1 can be expressed by the following expression (11).

$$V1 = V_+ - Rf1 \times Ic \qquad (11)$$

Meanwhile, the voltage of the cell balancing input terminal VB1 can be expressed by the following expression (12).

$$VB1 = V_+ \qquad (12)$$

Therefore, the offset voltage comparator COMP_1 compares the voltage of the input terminal V1 with the voltage of the cell balancing input terminal VB1, thereby detecting the leak current flowing through the filter capacitor C1. This is the same in the filter capacitors C2 to Cm.

Figure 11:
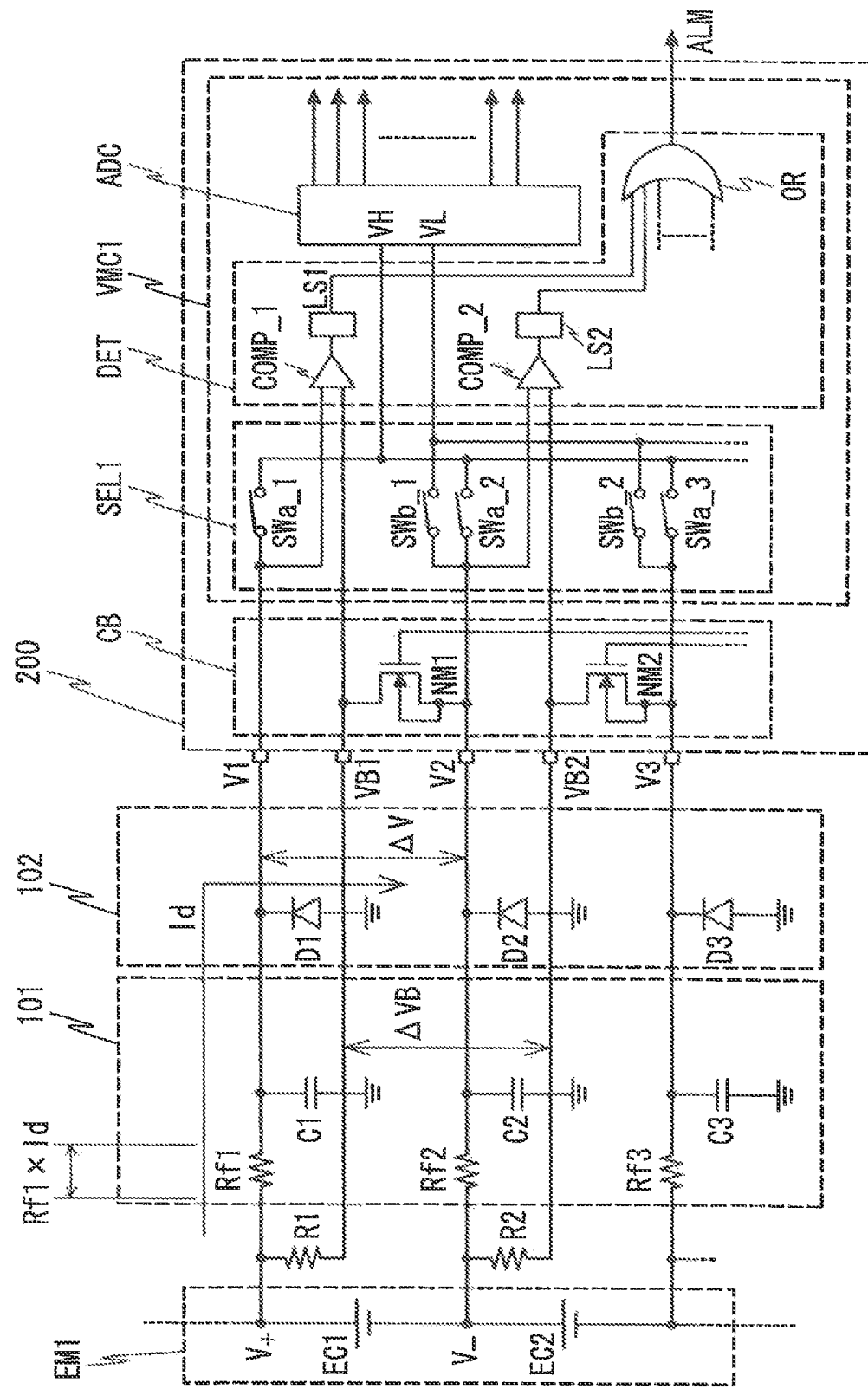
FIG. 11 is a circuit diagram showing voltage measurement of the voltage monitoring module 200 when a leak current flows through the protection diode D1.
Figure 12:
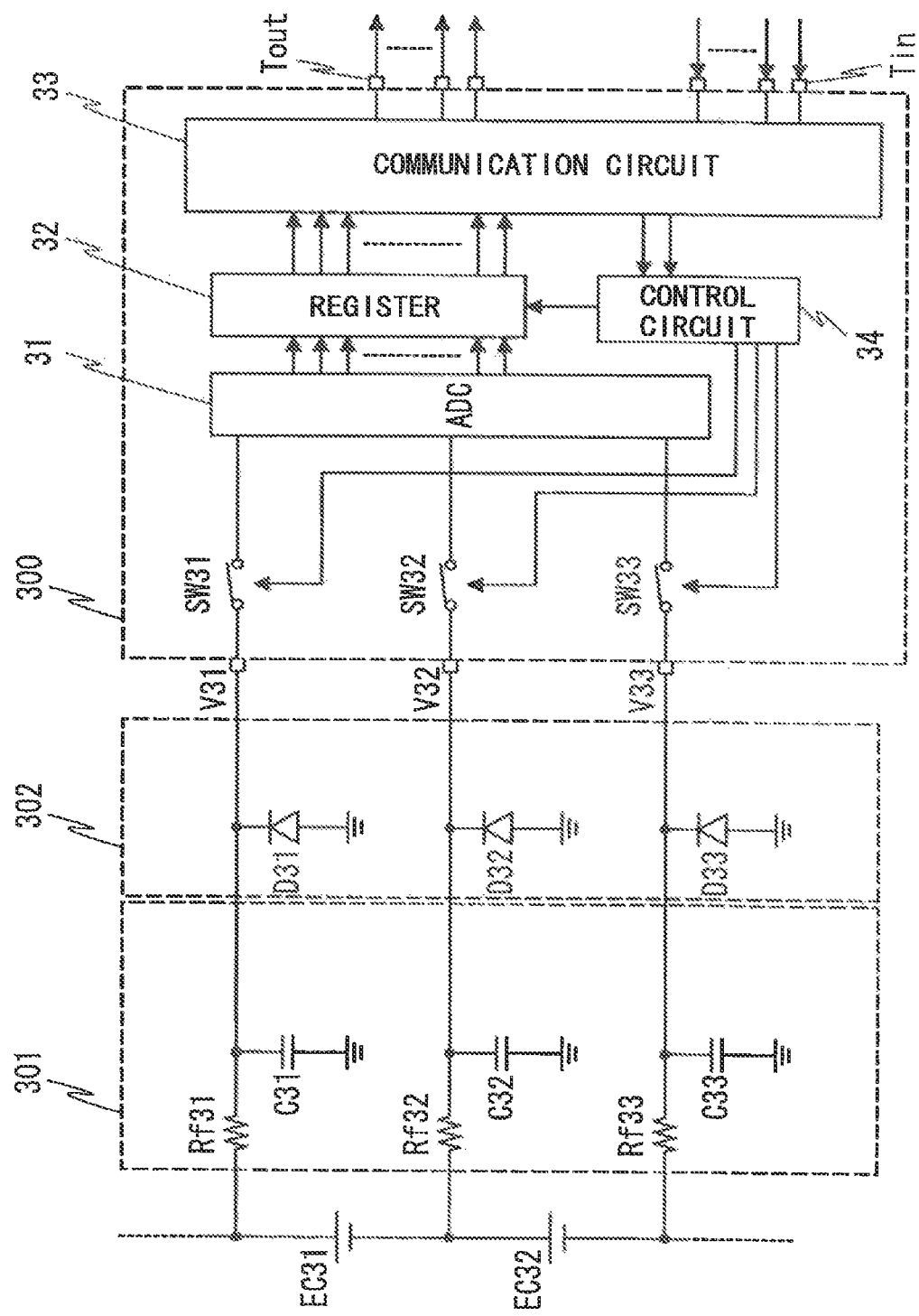
FIG. 12 is a circuit diagram showing a configuration example of a main part of a voltage monitoring module 300 monitoring voltages of battery cells.
Figure 13:
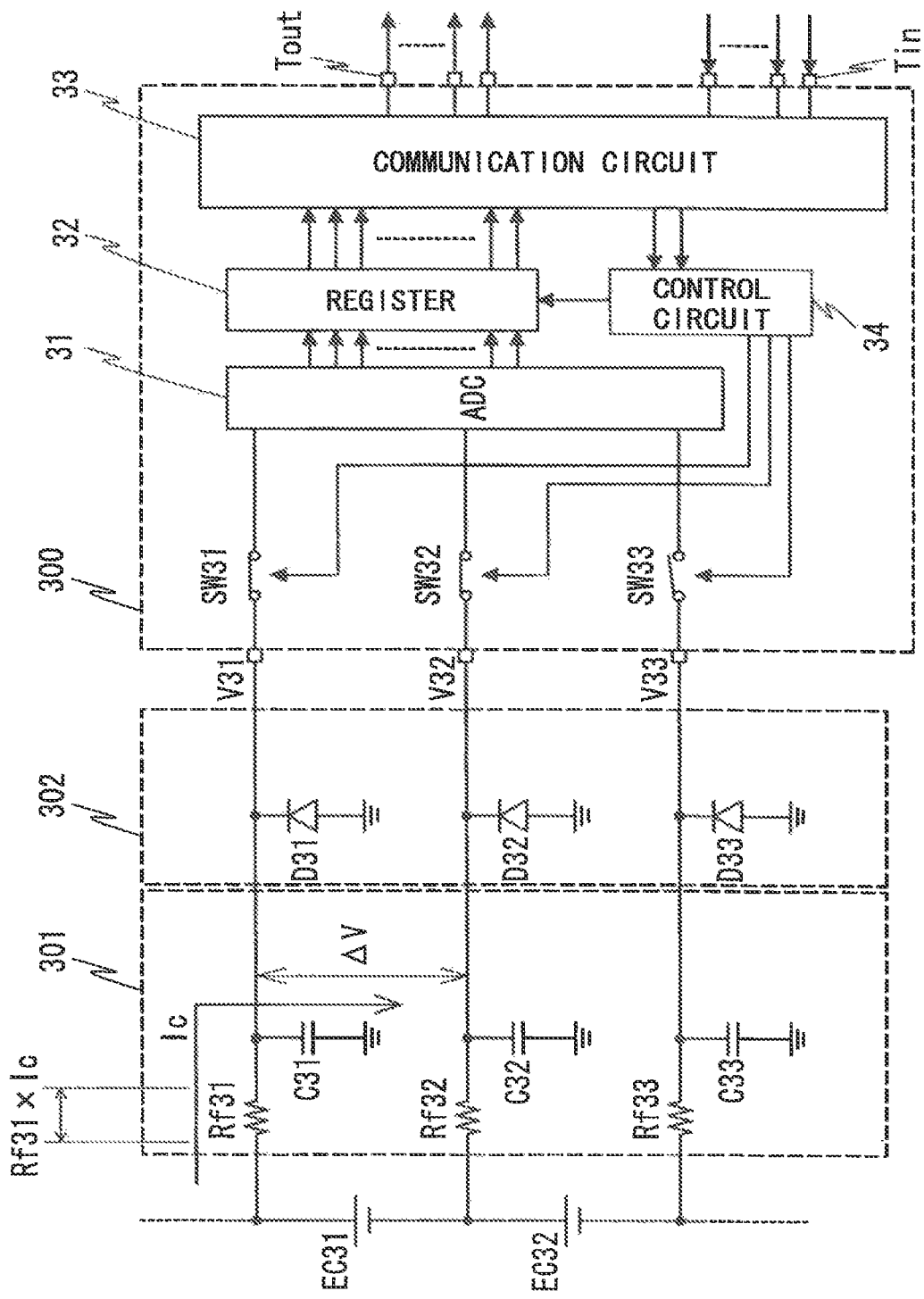
FIG. 13 is a circuit diagram showing voltage measurement of the voltage monitoring module 300 when a leak current flows through the filter capacitor C31.
Figure 14:
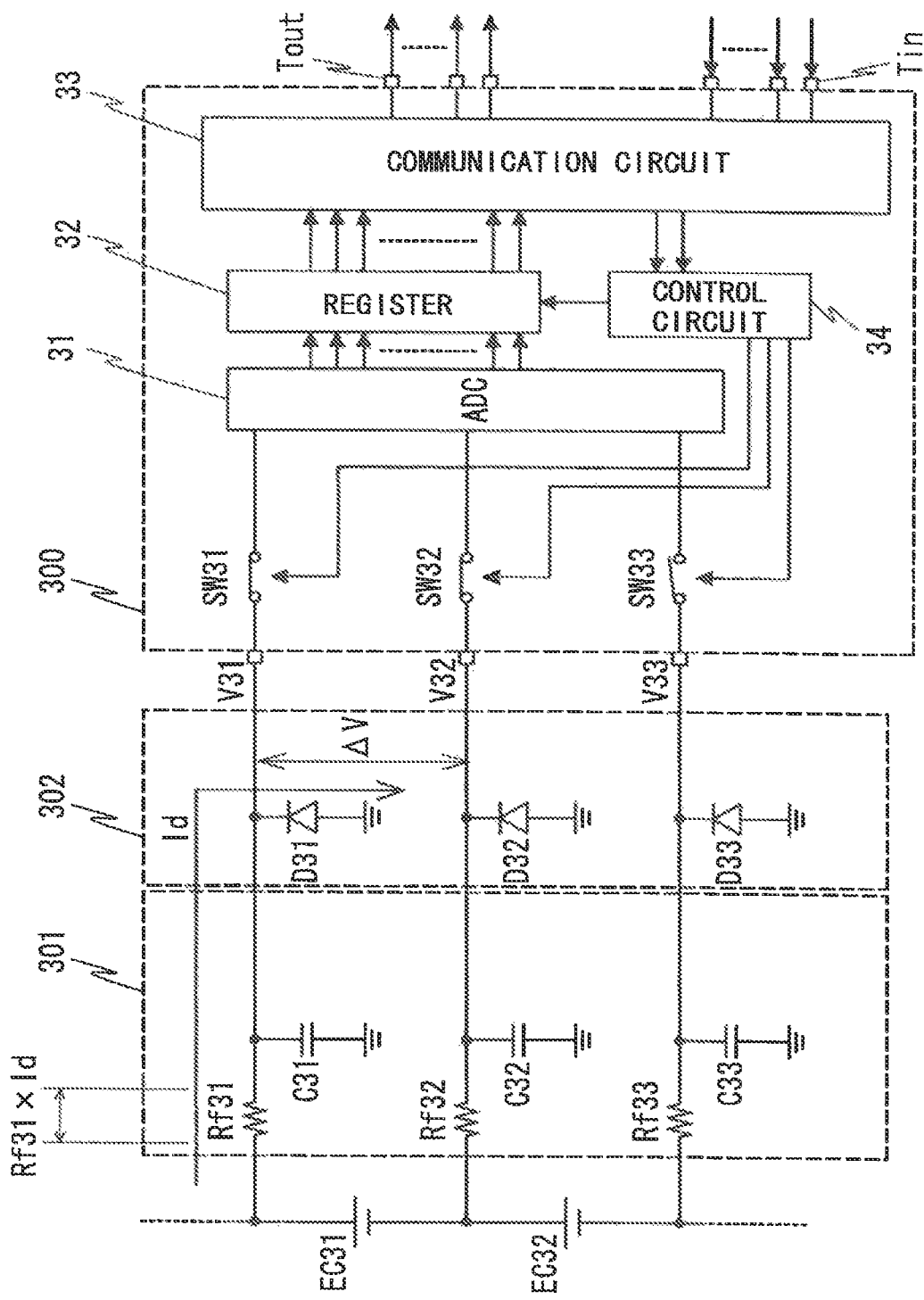
FIG. 14 is a circuit diagram showing voltage measurement of the voltage monitoring module 300 when a leak current flows through the protection diode D31.

Similarly, the case where a leak current Id flows through the protection diode D1 due to malfunction of the protection diode D1 is considered. FIG. 11 is a circuit diagram showing voltage measurement of the voltage monitoring module 200 when a leak current flows through the protection diode D1. As shown in FIG. 11, a voltage drop occurs at the filter resistor Rf1 when the leak current Id flows. The voltage drop VRf1 generated by the filter resistor Rf1 is Rf1×Id. Thus, the voltage of the input terminal V1 can be expressed by the following expression (13).

$$V1 = V_+ - Rf1 \times Id \qquad (13)$$

Therefore, voltage of the cell balancing input terminal VB1 can be expressed by the following expression (14).

$$VB1 = V+ \qquad (14)$$

Therefore, the offset voltage comparator COMP_1 compares the voltage of the input terminal V1 with the voltage of the cell balancing input terminal VB1, thereby detecting the leak current flowing through the protection diode D1. This is the same in the protection diode D2 to Dm.

In sum, when the leak current flows through an element of an external circuit coupled to the input terminal, the detection circuit DET detects occurrence of the leak current, and notifies the cell monitoring unit CMU of the occurrence of the leak current.

When any of the output signals from the offset voltage comparators COMP_1 to COMP_m is High level, High level signal is output as the leak detection signal ALM from the OR circuit OR to the cell monitoring unit CMU. Therefore, the cell monitoring unit CMU can detect the occurrence of the leak current. In this case, the cell monitoring unit CMU outputs the leak detection signal to the battery management unit BMU (step S208). The battery management unit BMU outputs a voltage monitoring malfunction warning to the engine control unit ECU based on the leak detection signal. The engine control unit ECU notifies an operator of the occurrence of the voltage monitoring malfunction of the battery cell EC1 by illustrating the occurrence of the voltage monitoring malfunction on the display devise or the like provided at a dashboard. Therefore, the operator can take measures to stop running or for troubleshooting.

Further, the engine control unit ECU can take measures to prevent the battery cell from being damaged according to the occurrence of the voltage monitoring malfunction of the battery cell. Specifically, when the malfunction is detected during electric charge, it is impossible to accurately measure the voltage of the battery cell. Therefore, the battery cell the voltage of which cannot be accurately measured may be overcharged in the case of being directly charged. In this case, the engine control unit ECU can prevent the occurrence of the overcharge by interrupting the supply of an external charging voltage CHARGE.

Meanwhile, when the all of the outputs signals from the offset voltage comparators COMP_1 to COMP_m are Low level, a Low level signal is output as the leak detection signal ALM from the OR circuit OR to the cell monitoring unit CMU. In this case, the voltage monitoring operation is finished because the there is no voltage monitoring malfunction.

As described above, according to the configuration, it is possible to provide the voltage monitoring module capable of detecting the voltage monitoring malfunction of the battery cell due to the occurrence of the leak current associated with the voltage monitoring of the battery cell as well as the voltage monitoring module 100.

Further, the voltage monitoring module 200 can notify the cell monitoring unit CMU of the occurrence of the leak from the detection circuit DET without interposition of the A/D converter ADC, the resister VMC_REG and the communication circuit VMM_C. Therefore, the voltage monitoring module 200 can detect the occurrence of the leak current without influences of malfunctions of the A/D converter ADC, the resister VMC_REG and the communication circuit VMM_C or the like. In sum, according to the configuration, more redundant detection of the voltage monitoring malfunction of the battery cell can be achieved.

Furthermore, in the voltage monitoring module 200, it is unnecessary to measure the battery cells EC1 to ECm using the selection circuit SEL2. As a result, the occurrence of the leak is detected more quickly than the voltage monitoring module 100, and power consumption can be decreased.

The present invention is not limited to the embodiments described above, and can be modified as appropriate without departing from the scope of the invention. For example, the protection diode according to the embodiments described above is externally coupled to the input terminal, but the protection diode may be externally coupled to the cell balancing input terminal.

Further, the protection diode may be placed in the voltage sensor module. In this case, the protection diode may be coupled to one or both of the input terminal and cell balancing input terminal.

This application is based upon and claims the benefit of priority from Japanese patent application No. 2011-79864, filed on Mar. 31, 2011, the disclosure of which is incorporated herein in its entirety by reference.

REFERENCE SIGNS LIST

31, ADC A/D Converter
32, VMC_REG Resister
33, VMM_C Communication Circuit
34, CON, VMC_CON Control Circuit
100, 200, 300 Voltage Monitoring Module
101, 301 Filter Circuit
10, 302 Protection Circuit
ALM LEAK Detection Signal
assy Assembled Battery
BMU Battery Management Unit
C31~C33 Filter Resistor
CHARGE External Charging Voltage
CMU CELL Monitoring Unit
COMP_1~COMP_m Offset Voltage Comparator
CON Control Circuit
D1~DM Protection Diode
D31~D33 Protection Diode
DET Detection Circuit
EC1~ECM, EC31, EC32 Battery Cell
ECU Engine Control Unit
EM1~EMn Battery Module
Ic, Id Leak Current
INS1, INS2 Insulating Element
INV Inverter
LS1~LSm Level Shifter
MG Motor Generator
NM1~NMm N-Channel Transistor
OR OR Circuit
REL1,REL2 Relay
Rf1~Rf3 Filter Resistor
Rf1~Rfm, Rf31~Rf33 Filter Resistor
CB1~CBm Cell Balancing Circuit
SEL1, SEL2 Selection Circuit
SIG_C, SIG_R, SIG_S1, SIG_S2, SIG_CB Control Signal
SW31~SW33, SWa_1~SWa_m, SWb_1~SWb_m, SWc_1~SWc_m SWITC
Tin Communication Input Terminal
Tout Communication Output Terminal
V1~Vm, V31~V33 Input Terminal
VB1~VBm Cell Balancing Input Terminal
VCC Power Supply Terminal
VH High-Voltage-Side Voltage
VL Low-Voltage-Side Voltage
VMC Voltage Measurement Circuit
VMC_ADC A/D Converter
VMC_SEL Selection Circuit
VMM_S Power Supply Circuit
VMM1~VMMn Voltage Monitoring Module
VMS Voltage Monitoring System
ΔV Normal Measurement Voltage
ΔVB Redundant Measurement Voltage

The invention claimed is:

1. A battery management device comprising:
a first terminal configured to detect a voltage of a first external electrode of a battery cell via a first path;
a second terminal configured to detect a voltage of a second external electrode of the battery cell via a second path;
a third terminal configured to couple with the first external electrode via a third path;
a fourth terminal configured to couple with the second external electrode via a fourth path;
a transistor configured to short-circuit the second terminal and the third terminal; and
a voltage measurement circuit configured to detect:
a first potential difference between the first path and the second path; and
a second potential difference between the third path and the fourth path, wherein
the battery management device is configured to detect a current leakage among the first path, the second path, the third path, and the fourth path by comparing the first potential difference and the second potential difference.

2. The battery management device according to claim 1, wherein the voltage measurement circuit comprises:
a voltage detection circuit configured to detect a potential difference between a first node and a second node, and
a routing circuit configured to couple the first path or the third path with the first node, and configured to couple the second path or the fourth path with the second node.

3. The battery management device according to claim 1, wherein the first path includes a filter circuit.

4. The battery management device according to claim 1, wherein the first path includes a voltage protection circuit.

5. The battery management device according to claim 1, wherein the first external electrode is a positive electrode of the battery cell, and
wherein the second external electrode is a negative electrode of the battery cell.

6. The battery management device according to claim 5, wherein the third path includes a resistor, and
wherein the battery management device is configured to discharge a charge of the battery cell via the third path and the second path through the transistor.

7. A battery management device comprising:
a first terminal configured to detect a voltage of a first external electrode of a battery cell via a first path;
a second terminal configured to detect a voltage of a second external electrode of the battery cell via a second path;
a third terminal configured to couple with the first external electrode via a third path;
a fourth terminal configured to couple with the second external electrode via a fourth path;
a first transistor, a second transistor, a third transistor, and a fourth transistor respectively coupled to the first terminal, the second terminal, the third terminal and the fourth terminal, the second transistor configured to short-circuit the second terminal and the third terminal;
a voltage measurement circuit configured to detect:
a first potential difference between the first path and the second path; and
a second potential difference between the third path and the fourth path; and
a control circuit configured to detect a current leakage among the first path, the second path, the third path, and the fourth paths by comparing the first potential difference and the second potential difference.

8. The battery management device according to claim 7, wherein the voltage measurement circuit comprises:
a voltage detection circuit configured to detect a potential difference between a first node and a second node, and
a routing circuit configured to couple the first path or the third path with the first node, and configured to couple the second path or the fourth path with the second node.

9. The battery management device according to claim 7, wherein the first path includes a filter circuit.

10. The battery management device according to claim 7, wherein the first path includes a voltage protection circuit.

11. The battery management device according to claim 7,
wherein the first external electrode is a positive electrode of the battery cell, and
wherein the second external electrode is a negative electrode of the battery cell.

12. The battery management device according to claim 11,
wherein the third path includes a resistor, and
wherein the control circuit is configured to discharge a charge of the battery cell via the third path and the second path through the transistor.

13. A battery control device comprising:
a first terminal configured to detect a voltage of a first external electrode of a battery cell via a first path;
a second terminal configured to detect a voltage of a second external electrode of the battery cell via a second path;
a third terminal configured to couple with the first external electrode via a third path;
a fourth terminal configured to couple with the second external electrode via a fourth path;
a transistor configured to short-circuit the second terminal and the third terminal;
a voltage measurement circuit configured to detect:
a first potential difference between the first path and the second path; and
a second potential difference between the third path and the fourth path; and
a control circuit configured to detect a current leakage among the first path, the second path, the third path, and the fourth paths by comparing the first potential difference and the second potential difference.

14. The battery control device according to claim 13,
wherein the voltage measurement circuit comprises:
a voltage detection circuit configured to detect a potential difference between a first node and a second node, and
a routing circuit configured to couple the first path or the third path with the first node, and configured to couple the second path or the fourth path with the second node.

15. The battery control device according to claim 13,
wherein the first path includes a filter circuit.

16. The battery control device according to claim 13,
wherein the first path includes a voltage protection circuit.

17. The battery control device according to claim 13,
wherein the first external electrode is a positive electrode of the battery cell, and
wherein the second external electrode is a negative electrode of the battery cell.

18. The battery control device according to claim 17,
wherein the third path includes a resistor, and
wherein the control circuit is configured to discharge a charge of the battery cell via the third path and the second path through the transistor.

* * * * *